(12) United States Patent
Choi et al.

(10) Patent No.: US 11,888,026 B2
(45) Date of Patent: Jan. 30, 2024

(54) INTEGRATED CIRCUIT DEVICE

(71) Applicant: Samsung Electronics Co., Ltd., Suwon-si (KR)

(72) Inventors: Minhee Choi, Suwon-si (KR); Seojin Jeong, Incheon (KR); Seokhoon Kim, Suwon-si (KR); Jungtaek Kim, Yongin-si (KR); Pankwi Park, Incheon (KR); Moonseung Yang, Hwaseong-si (KR); Ryong Ha, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 203 days.

(21) Appl. No.: 17/467,944

(22) Filed: Sep. 7, 2021

(65) Prior Publication Data
US 2022/0190109 A1 Jun. 16, 2022

(30) Foreign Application Priority Data
Dec. 11, 2020 (KR) .......................... 10-2020-0173677

(51) Int. Cl.
*H01L 29/06* (2006.01)
*H01L 29/786* (2006.01)
*H01L 29/66* (2006.01)

(52) U.S. Cl.
CPC ...... *H01L 29/0665* (2013.01); *H01L 29/6656* (2013.01); *H01L 29/78618* (2013.01)

(58) Field of Classification Search
CPC ......... H01L 21/02603; H01L 21/28141; H01L 29/0653; H01L 29/0665; H01L 29/0669; H01L 29/0673; H01L 29/66439; H01L 29/6653; H01L 29/66553; H01L 29/6656; H01L 29/66636; H01L 29/775; H01L 29/7848; H01L 29/78618
See application file for complete search history.

(56) References Cited

U.S. PATENT DOCUMENTS

| | | | |
|---|---|---|---|
| 9,287,399 B2 | 3/2016 | Chandra et al. | |
| 9,761,719 B2 | 9/2017 | Kim et al. | |
| 10,658,510 B2 | 5/2020 | Liu et al. | |
| 10,672,764 B2 | 6/2020 | Kim et al. | |
| 10,763,363 B2 | 9/2020 | Lin et al. | |
| 2009/0184341 A1 | 7/2009 | Chong et al. | |
| 2015/0084096 A1* | 3/2015 | Chandra | H01L 29/36 257/192 |

(Continued)

*Primary Examiner* — David C Spalla
(74) *Attorney, Agent, or Firm* — Muir Patent Law, PLLC

(57) ABSTRACT

An integrated circuit device includes a fin-type active region on a substrate; at least one nanosheet having a bottom surface facing the fin top; a gate line on the fin-type active region; and a source/drain region on the fin-type active region, adjacent to the gate line, and in contact with the at least one nanosheet, wherein the source/drain region includes a lower main body layer and an upper main body layer, a top surface of the lower main body layer includes a lower facet declining toward the substrate as it extends in a direction from the at least one nanosheet to a center of the source/drain region, and the upper main body layer includes a bottom surface contacting the lower facet and a top surface having an upper facet. With respect to a vertical cross section, the lower facet extends along a corresponding first line and the upper facet extends along a second line that intersects the first line.

20 Claims, 35 Drawing Sheets

(56) References Cited

U.S. PATENT DOCUMENTS

| | | |
|---|---|---|
| 2016/0104673 A1 | 4/2016 | Tung |
| 2019/0252376 A1* | 8/2019 | Kim ........................ H01L 29/78 |
| 2019/0312143 A1* | 10/2019 | Lin ................... H01L 29/66795 |
| 2020/0020774 A1* | 1/2020 | Lee ................... H01L 29/66439 |
| 2020/0083354 A1 | 3/2020 | Sung et al. |
| 2020/0135550 A1 | 4/2020 | Chen et al. |
| 2020/0168735 A1* | 5/2020 | Yu ................... H01L 21/823431 |
| 2020/0220015 A1 | 7/2020 | Jang et al. |
| 2020/0279944 A1 | 9/2020 | Liu et al. |
| 2021/0082914 A1* | 3/2021 | Lee ................. H01L 21/823468 |
| 2022/0037520 A1* | 2/2022 | More ................ H01L 29/78687 |

* cited by examiner

INTEGRATED CIRCUIT DEVICE

CROSS-REFERENCE TO RELATED APPLICATION

This application is based on and claims priority under 35 U.S.C. § 119 to Korean Patent Application No. 10-2020-0173677, filed on Dec. 11, 2020, in the Korean Intellectual Property Office, the disclosure of which is incorporated by reference herein in its entirety.

BACKGROUND

The inventive concept relates to an integrated circuit device, and more particularly, to an integrated circuit device including a field-effect transistor.

With the rapid development of down-scaling of integrated circuit devices, it is necessary to secure the accuracy of the operations of integrated circuit devices as well as the fast operating speed thereof. With the increase in the integration density of integrated circuit devices and the decrease in the size thereof, there is a need to develop a new structure for increasing the performance and reliability of a nanosheet field-effect transistor.

SUMMARY

The inventive concept provides an integrated circuit device for reducing the contact resistance of a source/drain region of a nanosheet field-effect transistor and improving the distribution of electrical characteristics thereof.

According to an aspect of the inventive concept, there is provided an integrated circuit device including a fin-type active region on a substrate and extending in a first horizontal direction; at least one nanosheet separated from a fin top of the fin-type active region in a vertical direction and having a bottom surface facing the fin top of the fin-type active region; a gate line on the fin-type active region, surrounding the at least one nanosheet, and extending in a second horizontal direction that is different from the first horizontal direction; and a source/drain region on the fin-type active region, adjacent to the gate line, and in contact with the at least one nanosheet, wherein the source/drain region includes a lower main body layer and an upper main body layer, the lower and upper main body layers being sequentially stacked on the fin-type active region in the vertical direction, wherein a top surface of the lower main body layer includes a lower facet declining toward the substrate as it extends in a direction from the at least one nanosheet to a center of the source/drain region, wherein the upper main body layer includes a bottom surface contacting the lower facet of the top surface of the lower main body layer, and a top surface having an upper facet, wherein with respect to a vertical cross section, the lower facet extends along a first line, the upper facet extends along a second line, and wherein the first line and the second line intersect each other.

According to another aspect of the inventive concept, there is provided an integrated circuit device including a fin-type active region on a substrate and extending long in a first horizontal direction; a recess formed in the fin-type active region; a pair of nanosheet stacks on a fin top of the fin-type active region and separated from each other in the first horizontal direction with the recess therebetween; a pair of gate lines on the fin-type active region, each gate line surrounding a corresponding one of the pair of nanosheet stacks, and extending in a second horizontal direction that is different from the first horizontal direction; and a source/drain region in the recess and in contact with each one of the pair of nanosheet stacks, wherein the source/drain region includes a lower main body layer and an upper main body layer, the lower and upper main body layers being sequentially stacked in the recess in the vertical direction, wherein a top surface of the lower main body layer includes a pair of lower facets each declining toward the substrate as it extends in a direction from one of the pair of nanosheet stacks to a center of the source/drain region, wherein and the upper main body layer includes a bottom surface contacting the pair of lower facets and a top surface having an upper facet, wherein with respect to a vertical cross section, each lower facet extends along a corresponding first line, the upper facet extends along a second line, and wherein each first line and the second line intersect each other.

According to a further aspect of the inventive concept, there is provided an integrated circuit device including a fin-type active region on a substrate and extending long in a first horizontal direction; a recess formed in the fin-type active region; a pair of nanosheet stacks on a fin top of the fin-type active region and separated from each other in the first horizontal direction with the recess therebetween; and a source/drain region in the recess and in contact with each one of the pair of nanosheet stacks, wherein the source/drain region includes a lower main body layer and an upper main body layer, the lower and upper main body layers being sequentially stacked in the recess in the vertical direction and each including an $Si_{1-x}Ge_x$ layer, where $0.15 \le x < 0.7$, wherein the lower main body layer has a first Ge concentration, and a top surface of the lower main body layer includes a pair of lower facets each declining toward the substrate as it extends in a direction from one of the pair of nanosheet stacks to a center of the source/drain region, wherein and the upper main body layer has a Ge concentration higher than the first Ge concentration and includes a bottom surface contacting the pair of lower facets and a top surface having an upper facet, wherein with respect to a vertical cross section, each lower facet extends along a corresponding first line, the upper facet extends along a second line, and wherein each first line and the second line intersect each other.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
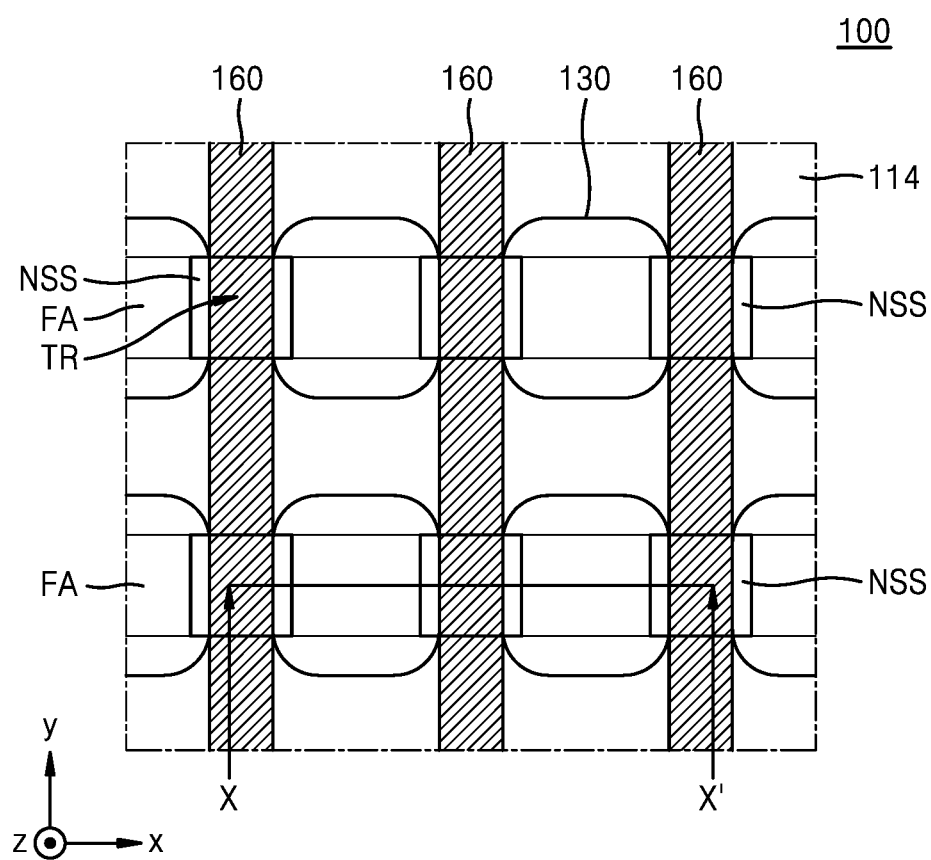
FIG. 1 is a plan view of a layout of partial configurations of an integrated circuit device, according to embodiments.

Hereinafter, embodiments will be described in detail with reference to the accompanying drawings. In the drawings, like reference characters denote like elements, and redundant descriptions thereof may be omitted.

Figure 2A:
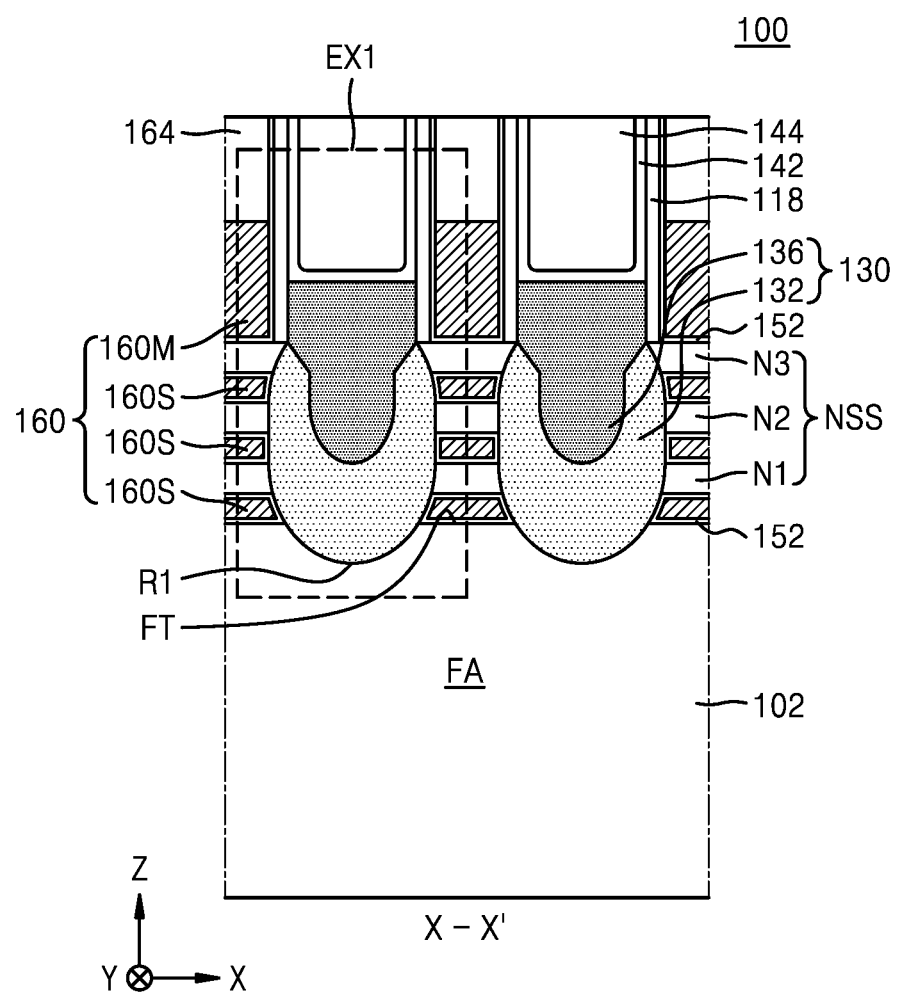
FIG. 2A is a cross-sectional view taken along line X-X' in FIG. 1.

FIG. 1 is a plan view of a layout of partial configurations of an integrated circuit device 100, according to embodiments. FIG. 2A is a cross-sectional view taken along line X-X' in FIG. 1 and FIG. 2B is an enlarged cross-sectional view of a partial region EX1 in FIG. 2A.

Figure 2B:
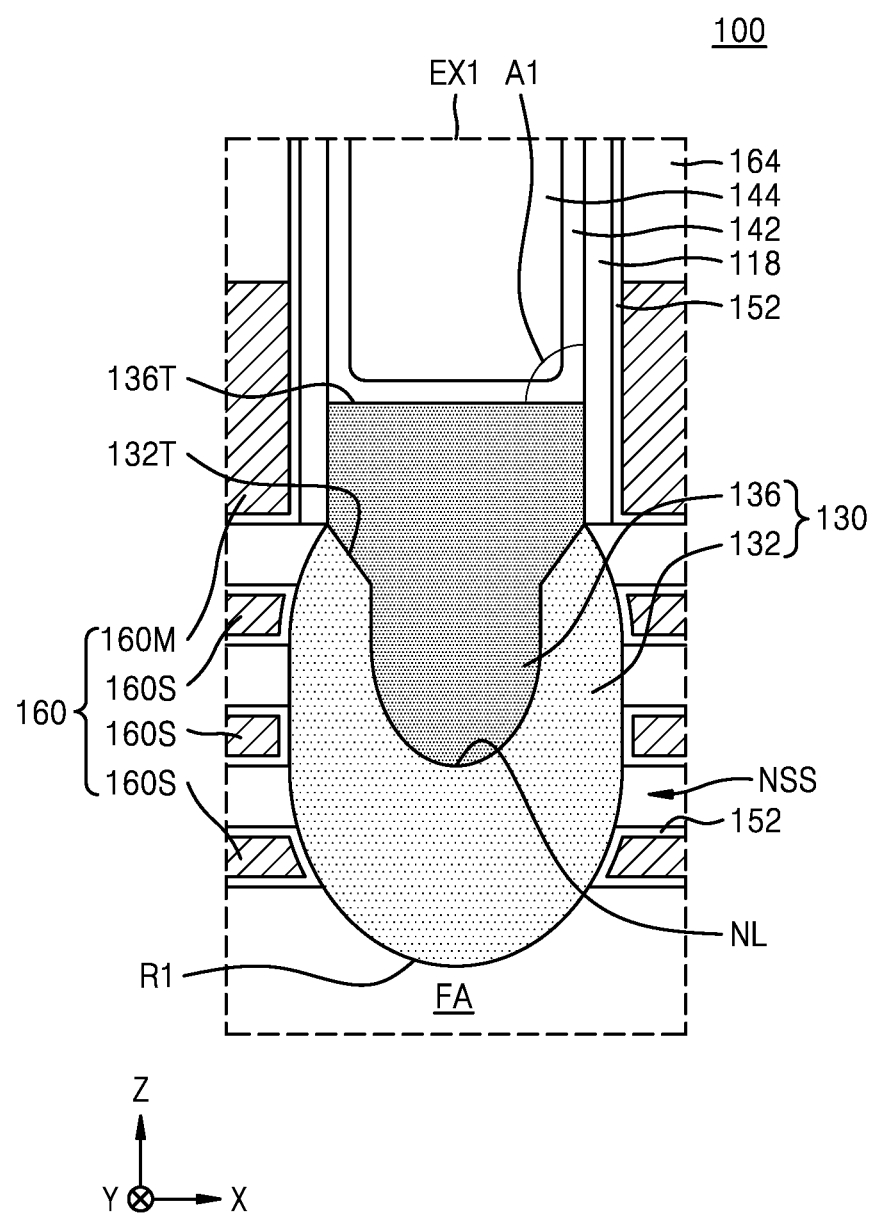
FIG. 2B is an enlarged cross-sectional view of a partial region in FIG. 2A.

Referring to FIGS. 1, 2A and 2B, the integrated circuit device 100 may include a plurality of fin-type active regions FA and a plurality of nanosheet stacks NSS on the fin-type active regions FA. The fin-type active regions FA protrude from a substrate 102 in a vertical direction (a Z direction) and extend long in a first horizontal direction (an X direction). The term "nanosheet" used herein refers to a conductive structure having a cross-section that is substantially perpendicular to a direction in which electric current flows. It will be understood that the nanosheet includes a nanowire.

The substrate 102 may include a semiconductor such as Si or Ge or a compound semiconductor such as SiGe, SiC, GaAs, InAs, InGaAs, or InP. Each of the terms "SiGe", "SiC", "GaAs", "InAs", "InGaAs", and "InP" used herein indicates a material composed of elements included in each term and is not a chemical equation representing stoichiometric relationships. In example embodiments, the main surface of the substrate 102 may have the {100} surface orientation.

An isolation film 114 (see FIG. 1), which covers both side walls of each of the fin-type active regions FA, may be provided on the substrate 102. The isolation film 114 may be an oxide film, a nitride film, or a combination thereof.

A plurality of gate lines 160 may extend long above the fin-type active regions FA in a second horizontal direction (a Y direction) that crosses the first horizontal direction (the X direction). Each of a plurality of nanosheet stacks NSS may be above a fin top FT of each of the fin-type active regions FA at an intersection between a corresponding one of the fin-type active regions FA and one of the gate lines 160. Each of the nanosheet stacks NSS may be separated from and face the fin top FT of a corresponding one of the fin-type active regions FA. Each of the nanosheet stacks NSS may include a plurality of nanosheets, which overlap each other above the fin top FT of a corresponding one of the fin-type active regions FA in the vertical direction (the Z direction). The nanosheets may respectively have different vertical distances (Z-direction distances) from the fin top FT. The nanosheets may include a first nanosheet N1, a second nanosheet N2, and a third nanosheet N3, which are sequentially stacked above the fin top FT of each of the fin-type active regions FA.

Although the nanosheet stacks NSS substantially have a rectangular shape in the plan view of FIG. 1, embodiments are not limited thereto. The nanosheet stacks NSS may have various plan view shapes according to plan view shapes of the fin-type active regions FA and the gate lines 160. The present embodiment illustrates the configuration, in which a plurality of nanosheet stacks NSS and a plurality of gate lines 160 are formed on one fin-type active region FA and the nanosheet stacks NSS are arranged on the fin-type active region FA in a line in the first horizontal direction (the X direction). However, the number of nanosheet stacks NSS and the number of gate lines 160 on one fin-type active region FA are not particularly limited.

Each of the first, second, and third nanosheets N1, N2, and N3 may have a channel region. For example, each of the first, second, and third nanosheets N1, N2, and N3 may have a thickness selected from a range from about 4 nm to about 6 nm. The thickness of each of the first, second, and third nanosheets N1, N2, and N3 refers to a size in the vertical direction (the Z direction). In example embodiments, the first, second, and third nanosheets N1, N2, and N3 may have substantially the same thickness as one another in the vertical direction (the Z direction). In example embodiments, at least some of the first, second, and third nanosheets N1, N2, and N3 may have different thicknesses from each other in the vertical direction (the Z direction).

In example embodiments, as shown in FIG. 2A, at least some of the first, second, and third nanosheets N1, N2, and N3 of one nanosheet stack NSS may have different sizes from each other in the first horizontal direction (the X direction). For example, the length of each of the first and second nanosheets N1 and N2, which are relatively close to the fin top FT, may be less than the length of the third nanosheet N3, which is farthest from the fin top FT, in the first horizontal direction (the X direction). In this case, an effective channel length of a channel formed in each of the first and second nanosheets N1 and N2 relatively close to the fin top FT may be less than that of a channel formed in the third nanosheet N3, and accordingly, the amount of current flowing in the first and second nanosheets N1 and N2 may increase at the same operating voltage. In some embodiments, differently from the illustration of FIG. 2A, at least some of the first, second, and third nanosheets N1, N2, and N3 may have the same size as one another in the first horizontal direction (the X direction).

A plurality of recesses R1 may be formed in a fin-type active region FA. Although FIGS. 2A and 2B illustrate the case where the level of the bottommost surface of each of the recesses R1 is lower than the level of the fin top FT of the fin-type active region FA, embodiments are not limited thereto. The level of the bottommost surface of each of the recesses R1 may be the same as or similar to the level of the fin top FT of the fin-type active region FA. In example embodiments, a vertical distance between the level of the bottommost surface of each of the recesses R1 and the level of the fin top FT of the fin-type active region FA may be about 0 nm to about 20 nm, but embodiments are not limited thereto. In the specification, the term "level" refers to a height from the top surface of the substrate 102 in the vertical direction (the Z direction or a −Z direction).

A plurality of source/drain regions 130 may be formed on the recesses R1. Each of the source/drain regions 130 may be in contact with the first, second, and third nanosheets N1, N2, and N3 of a nanosheet stack NSS adjacent thereto. The source/drain regions 130 may include an epitaxially-grown semiconductor layer (a crystalline semiconductor layer that may be formed of several homogenous epitaxially-grown semiconductor sub-layers each of which being formed of the same semiconductor material composition). In example embodiments, the source/drain regions 130 may include a combination of a Group IV semiconductor and a Group IV compound semiconductor (i.e., at least one portion formed of only the same Group IV semiconductor material as the intrinsic semiconductor material (e.g., Si) and another portion formed of a Group IV compound semiconductor material as the intrinsic semiconductor material (e.g., SiGe)). Each of the source/drain regions 130 may be at least partially doped with a charge carrier dopant, such as with a p-type dopant. In example embodiments, the p-type dopant may be selected from boron (B) and gallium (Ga).

Each of the source/drain regions 130 may include a lower main body layer 132 and an upper main body layer 136, which are sequentially stacked in a direction away from the fin-type active region FA in the vertical direction (the Z direction). Each of the lower main body layer 132 and the upper main body layer 136 may include an $Si_{1-x}Ge_x$ layer doped with a p-type dopant (where $0.15 \leq x < 0.7$). The upper main body layer 136 may have a higher Ge concentration than the lower main body layer 132. In example embodiments, the Ge concentration in the lower main body layer 132 may be greater than or equal to about 0.15 at % and less than about 0.40 at %, and the Ge concentration in the upper main body layer 136 may be greater than or equal to about 0.40 at % and less than or equal to about 0.70 at %, but embodiments are not limited thereto. In example embodiments, the p-type dopant may include at least one selected from B and Ga.

The top surface of the lower main body layer 132 may include a pair of lower facets 132T and a non-linear top surface NL, which are in contact with the bottom surface of the upper main body layer 136. The non-linear top surface NL may be between the lower facets 132T. Each of the lower facets 132T of the lower main body layer 132 may include a surface, which declines toward the substrate 102 in a direction from a nanosheet stack NSS to the center of a source/drain region 130. The non-linear top surface NL of the lower main body layer 132 may include a surface having a concave shape facing the upper main body layer 136. Non-linear as used in this context (and similar usages herein) refers to non-linear with respect to the vertical cross section of the device shown in the related figure (here FIGS. 2A and 2B); this and other non-linear surfaces thus are non-planar surfaces (e.g., a concave or convex three dimensional surface).

The upper main body layer 136 may include the bottom surface, which is in contact with the lower facets 132T and the non-linear top surface NL of the lower main body layer 132, and a top surface separated from the lower main body layer 132 in the vertical direction (the Z direction). The top surface of the upper main body layer 136 may include a flat surface extending in the first horizontal direction (the X direction). The top surface of the upper main body layer 136 may include an upper facet 136T. With respect to the vertical cross section of FIGS. 2A and 2B, each lower facet 132T extends along a corresponding first line (i.e., a geometric straight line), the upper facet extends 136T along a second line, and each corresponding first line intersects with the second line.

The upper main body layer 136 of each source/drain region 130 may include a vertical overgrowth portion at a higher level than the fin top FT in the vertical direction (the Z direction). The upper facet 136T of the upper main body layer 136 may form the top surface of the vertical overgrowth portion and may form the top surface of the source/drain region 130. The upper facet 136T of the upper main body layer 136 may be at a higher level than the topmost surface of a nanosheet stack NSS. In example embodiments, a height difference between the upper facet 136T of the upper main body layer 136 and the fin top FT in the vertical direction (the Z direction) may be at least 2 nm.

In example embodiments, the lower facets 132T may have the {111} surface orientation (i.e., have a (111) surface), and the upper facet 136T may have the {100} surface orientation (i.e., have a (100) surface).

A gate line 160 may extend long above the fin-type active region FA and the isolation film 114 (see FIG. 1) in the second horizontal direction (the Y direction). The gate line 160 may be on the fin-type active region FA to cover the nanosheet stack NSS and, with respect to a cross section taken in the Y-Z plane (perpendicular to the X direction), surround each of the first, second, and third nanosheets N1, N2, and N3.

Each gate line 160 may include a main gate portion 160M and a plurality of sub gate portions 160S. The main gate portion 160M may extend in the second horizontal direction (the Y direction) to cover the top surface of the nanosheet stack NSS. The sub gate portions 160S may be integrally connected to the main gate portion 160M and respectively between the third nanosheet N3 and the second nanosheet N2, between the second nanosheet N2 and the first nanosheet N1, and between the first nanosheet N1 and the fin-type active region FA.

The thickness of each of the sub gate portions 160S may be less than that thickness of the main gate portion 160M in the vertical direction (the Z direction). The first, second, and third nanosheets N1, N2, and N3 may be surrounded by the gate line 160 with respect to a cross section taken in the Y-Z plane (perpendicular to the X direction).

The gate line 160 may include a metal, a metal nitride, a metal carbide, or a combination thereof. The metal may be selected from Ti, W, Ru, Nb, Mo, Hf, Ni, Co, Pt, Yb, Tb, Dy, Er, and Pd. The metal nitride may be selected from TiN and TaN. The metal carbide may include TiAlC.

A gate dielectric film 152 may be between the nanosheet stack NSS and the gate line 160. In example embodiments, the gate dielectric film 152 may include a stack structure of an interface film and a high-k dielectric film. The interface film may include a low-k dielectric film, e.g., a silicon oxide film, a silicon oxynitride film, or a combination thereof, having a permittivity of about 9 or less. In example embodiments, the interface film may be omitted. The high-k dielectric film may include a material having a higher dielectric constant than a silicon oxide film. For example, the high-k dielectric film may have a dielectric constant of about 10 to about 25. The high-k dielectric film may include hafnium oxide but is not limited thereto.

A nanosheet transistor TR may be formed on the substrate 102 at each of the crossings of a gate line 160 and fin-type active regions FA.

In example embodiments, the first, second, and third nanosheets N1, N2, and N3 may respectively include semiconductor layers formed of the same semiconductor material composition. For example, each of the first, second, and third nanosheets N1, N2, and N3 may be an Si layer. In some examples, the first, second, and third nanosheets N1, N2, and N3 may be formed of an undoped Si layer. In some examples, the first, second, and third nanosheets N1, N2, and N3 may be doped with a dopant of the same conductivity type as the source/drain region 130. For example, the first, second, and third nanosheets N1, N2, and N3 may include an Si layer doped with a p-type dopant. The p-type dopant may include B, Ga, or a combination thereof but is not limited thereto. In some examples, the first, second, and third nanosheets N1, N2, and N3 may be doped with a dopant of the opposite conductivity type as that of the source/drain region 130 (e.g., n-type dopant when the source/drain region 130 is doped with a p-type dopant, and a p-type dopant when the source/drain region 130 is doped with an n-type dopant).

The top surfaces of each gate line 160 and the gate dielectric film 152 may be covered with a capping insulating pattern 164. The capping insulating pattern 164 may include a silicon nitride film.

Both side walls of each of the gate line 160 and the capping insulating pattern 164 above the fin-type active region FA and the isolation film 114 may be covered with a plurality of outer insulating spacers 118. The outer insulating spacers 118 may be above the top surface of the nanosheet stack NSS to cover both side walls of each of the main gate portion 160M and the capping insulating pattern 164. Each of the outer insulating spacers 118 may be separated from the gate line 160 with the gate dielectric film 152 between each outer insulating spacer 118 and the gate line 160. The outer insulating spacers 118 may include silicon nitride (SiN), silicon oxide (SiO), SiCN, SiBN, SiON, SiOCN, SiBCN, SiOC, or a combination thereof. Each of the terms "SiN", "SiO", "SiCN", "SiBN", "SiON", "SiOCN", "SiBCN", and "SiOC" used herein indicates a material composed of the elements of each term and is not a chemical equation representing stoichiometric relationships.

Each of a plurality of source/drain regions 130 may be in contact with an outer insulating spacer 118 adjacent thereto. The upper facet 136T of the upper main body layer 136 of each source/drain region 130 may contact a side wall of the outer insulating spacer 118. In example embodiments, an angle A1 between the upper facet 136T of the upper main body layer 136 and the side wall of the outer insulating spacer 118, which abut on each other, may be about 90 degrees.

As shown in FIGS. 2A and 2B, each source/drain region 130 may include a portion overlapping the outer insulating spacer 118 in the vertical direction (the Z direction). For example, the width of the portion of the source/drain region 130, which overlaps the outer insulating spacer 118 in the vertical direction (the Z direction), in the first horizontal direction (the X direction) may be selected from a range between 0 nm to about 4 nm. In example embodiments, each source/drain region 130 may not include a portion overlapping the main gate portion 160M in the vertical direction (the Z direction). In example embodiments, each source/drain region 130 may not include a portion overlapping the outer insulating spacer 118 in the vertical direction (the Z direction).

A side wall of each of the sub gate portions 160S respectively between the third nanosheet N3 and the second nanosheet N2, between the second nanosheet N2 and the first nanosheet N1, and between the first nanosheet N1 and the fin-type active region FA may be separated from the source/drain region 130 with the gate dielectric film 152 between the side wall of each sub gate portion 160S and the source/drain region 130. The gate dielectric film 152 may include a portion that is in contact with the source/drain region 130.

The bottoms of each source/drain region 130 may face the nanosheet stack NSS and the sub gate portions 160S in the first horizontal direction (the X direction). The upper main body layer 136 of the source/drain region 130 may be separated from the nanosheet stack NSS and the sub gate portions 160S with the lower main body layer 132 between the upper main body layer 136 and each of the nanosheet stack NSS and the sub gate portions 160S.

In example embodiments, the lower main body layer 132 of the source/drain region 130 may include at least two portions having different Ge concentrations from each other. In this case, a lower portion of the lower main body layer 132, which is adjacent to the fin-type active region FA, may include a first $Si_{1-x}Ge_x$ layer doped with a p-type dopant (where $0.15 \leq x < 0.2$), and an upper portion of the lower main body layer 132, which is adjacent to the upper main body layer 136, may include a second $Si_{1-x}Ge_x$ layer doped with a p-type dopant (where $0.2 \leq x < 0.4$). However, the compositions of the first and second $Si_{1-x}Ge_x$ layers are not limited to those given above.

In example embodiments, the upper main body layer 136 of the source/drain region 130 may include at least two portions having different Ge concentrations from each other. In this case, a lower portion of the upper main body layer 136, which is adjacent to the lower main body layer 132, may include a third $Si_{1-x}Ge_x$ layer doped with a p-type dopant (where $0.3 \leq x < 0.5$), and a portion of the upper main body layer 136, which is farthest from the lower main body layer 132, may include a fourth $Si_{1-x}Ge_x$ layer doped with a p-type dopant (where $0.5 \leq x < 0.7$). However, the compositions of the third and fourth $Si_{1-x}Ge_x$ layers are not limited to those given above.

As shown in FIGS. 2A and 2B, a plurality of outer insulating spacers 118 and a plurality of source/drain regions 130 may be covered with a protective insulating film 142. The protective insulating film 142 may include silicon nitride (SiN), silicon oxide (SiO), SiCN, SiBN, SiON, SiOCN, SiBCN, SiOC, or a combination thereof. The protective insulating film 142 may be in contact with the upper facet 136T of the upper main body layer 136. In example embodiments, the protective insulating film 142 may be omitted.

An intergate insulating film 144 may be formed on the protective insulating film 142. The intergate insulating film 144 may include a silicon nitride film, a silicon oxide film, SiON, SiOCN, or a combination thereof. When the protective insulating film 142 is omitted, the intergate insulating film 144 may be in contact with the upper facet 136T of the upper main body layer 136.

The lower main body layer 132 and the upper main body layer 136 of the source/drain region 130 may apply strain to the first, second, and third nanosheets N1, N2, and N3 of the nanosheet stack NSS. The higher the Ge concentration in each of the lower main body layer 132 and the upper main body layer 136, the greater the strain that is applied to the first, second, and third nanosheets N1, N2, and N3, and accordingly, a carrier mobility of the first, second, and third nanosheets N1, N2, and N3 may be increased.

Because each of a plurality of source/drain regions 130 includes the lower main body layer 132 having a pair of lower facets 132T and the upper main body layer 136 having the upper facet 136T in the integrated circuit device 100, the source/drain regions 130 formed on the fin-type active region FA may have a uniform shape and size. Accordingly, the source/drain regions 130 forming a plurality of nanosheet transistors TR may have a uniformly controlled shape, and therefore, the contact resistance of the source/drain regions 130 may be reduced, and the distribution of electrical characteristics of the source/drain regions 130 may be improved. As a result, the reliability of the integrated circuit device 100 may be increased.

Figure 3A:
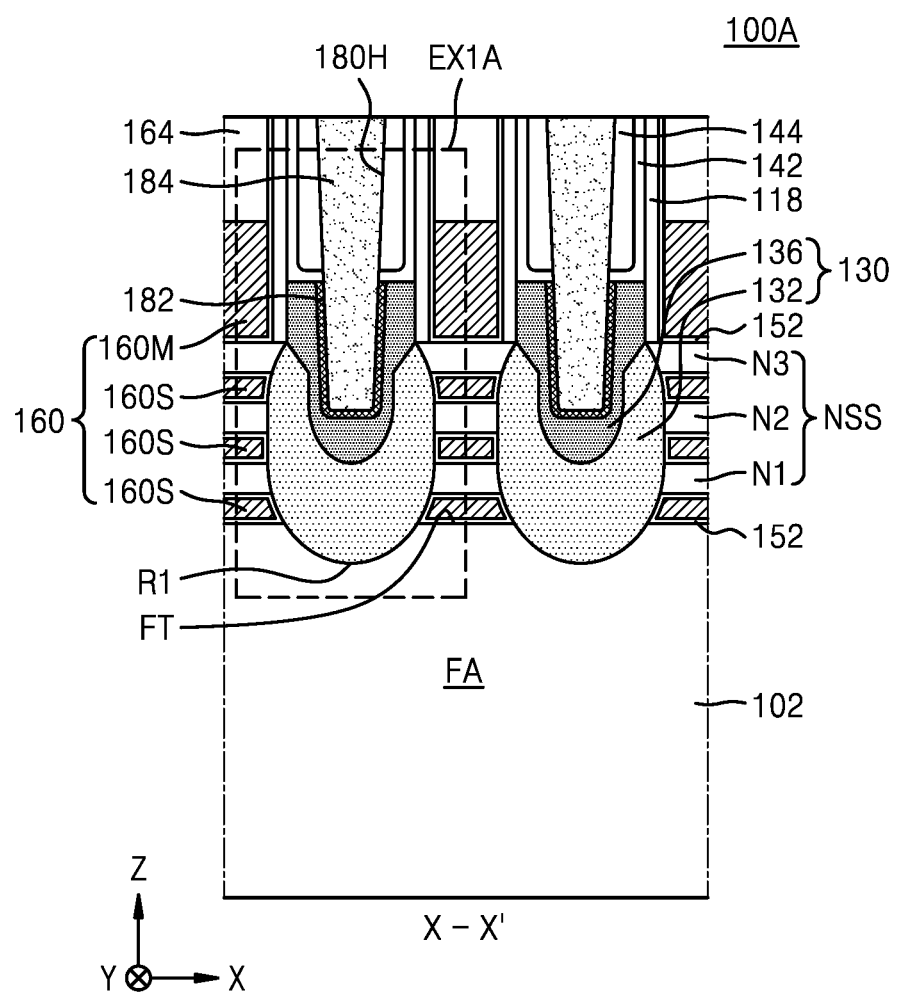
FIGS. 3A and 3B are cross-sectional views of an integrated circuit device according to some embodiments.
Figure 3B:
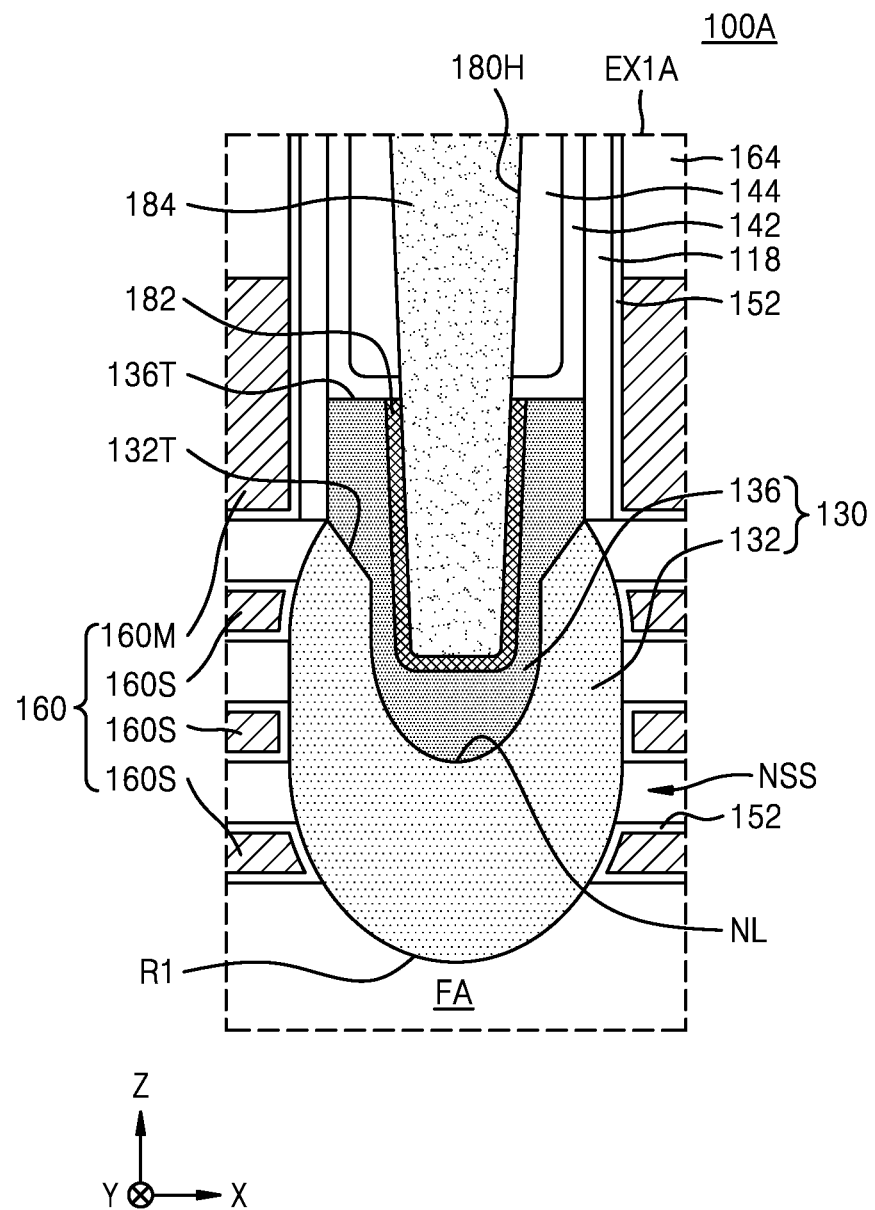

FIGS. 3A and 3B are cross-sectional views of an integrated circuit device 100A according to some embodiments. FIG. 3A illustrates a partial configuration of a portion corresponding to the cross-section taken along the line X-X' in FIG. 1. FIG. 3B is an enlarged cross-sectional view of a partial region EX1A in FIG. 3A.

Referring to FIGS. 3A and 3B, the integrated circuit device 100A may have substantially the same configuration as the integrated circuit device 100 described with reference to FIGS. 1, 2A and 2B. However, the integrated circuit device 100A may further include a plurality of source/drain contacts 184 on the source/drain regions 130. A metal silicide film 182 may be between a source/drain region 130 and a source/drain contact 184. Each source/drain contact 184 may fill a contact hole 180H, which passes through the intergate insulating film 144 and the protective insulating film 142 in the vertical direction (the Z direction) and extends inside the source/drain region 130. The source/drain region 130 may be separated from the source/drain contact 184 with the metal silicide film 182 between the source/drain region 130 and the source/drain contact 184. The source/drain region 130 may be outside the contact hole 180H and surround a lower portion of the source/drain contact 184.

The upper facet 136T of the upper main body layer 136 of the source/drain region 130 may include a flat surface extending between an outer insulating spacer 118 adjacent thereto and the source/drain contact 184 in the first horizontal direction (the X direction).

The metal silicide film 182 may be or include titanium silicide but is not limited thereto. In some embodiments, the metal silicide film 182 may be omitted. A plurality of source/drain contacts 184 may include metal, conductive metal nitride, or a combination thereof. For example, each source/drain contact 184 may be W, Cu, Al, Ti, Ta, TiN, TaN, an alloy thereof, or a combination thereto.

Figure 4:
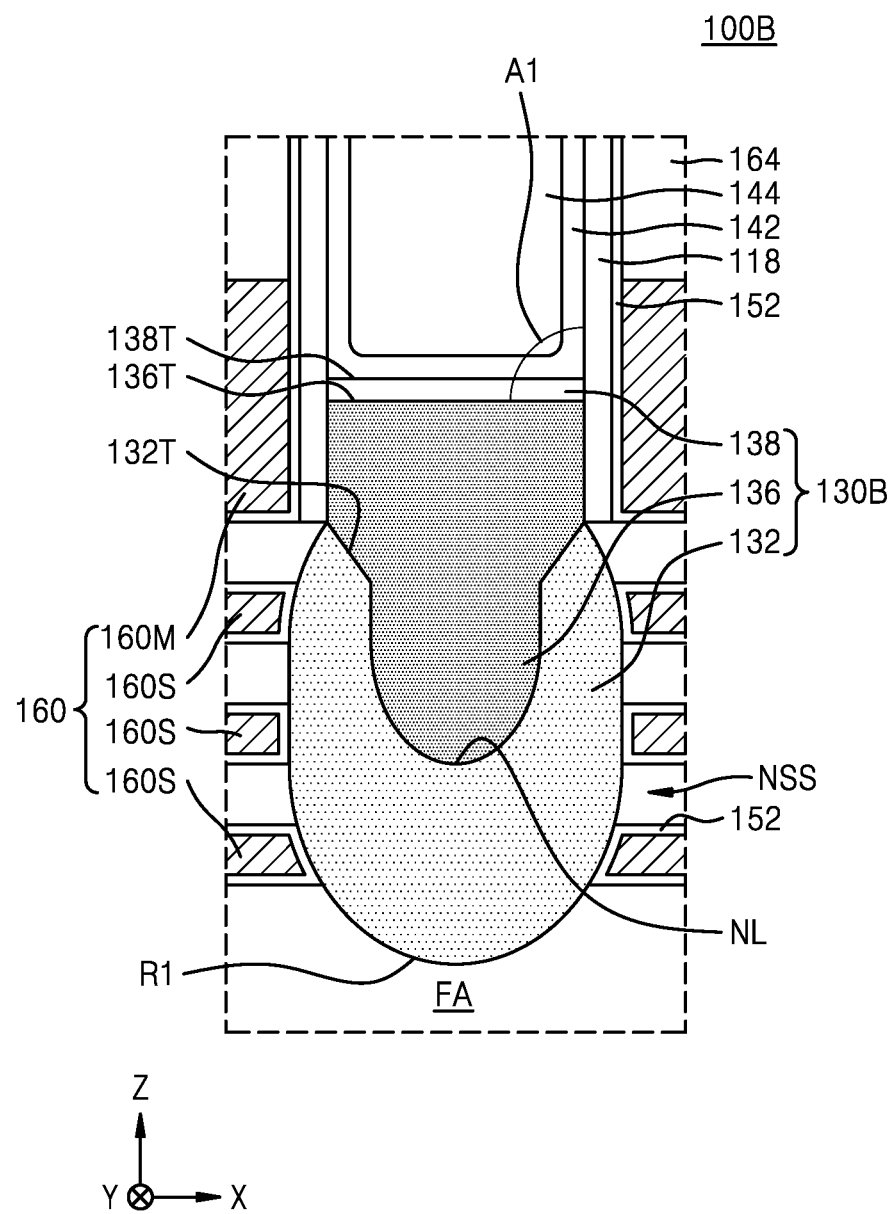
FIG. 4 is a cross-sectional view of an integrated circuit device according to some embodiments.

FIG. 4 is a cross-sectional view of an integrated circuit device 100B according to some embodiments. FIG. 4 illustrates a partial configuration of the portion corresponding to the cross-section taken along the line X-X' in FIG. 1.

Referring to FIG. 4, the integrated circuit device 100B may have substantially the same configuration as the integrated circuit device 100 described with reference to FIGS. 1, 2A and 2B. However, the integrated circuit device 100B may include a source/drain region 130B instead of the source/drain region 130. The source/drain region 130B may have substantially the same configuration as the source/drain region 130 described with reference to FIGS. 1, 2A and 2B. However, the source/drain region 130B further includes a capping layer 138 contacting the upper facet 136T of the upper main body layer 136.

The top surface of the capping layer 138 may include a capping facet 138T, which extends in the same direction as the upper facet 136T. The upper facet 136T and the capping facet 138T may extend in the first horizontal direction (the X direction) at different vertical levels to be parallel with each other. The capping facet 138T may extend in a direction, which intersects with the direction of each of the lower facets 132T of the lower main body layer 132. In example embodiments, the capping facet 138T may have the {100} surface orientation.

The capping layer 138 of the source/drain region 130B may be at a higher level than the topmost level of the nanosheet stack NSS in the vertical direction (the Z direction) and cover the top surface of the upper main body layer 136. The capping layer 138 may be separated from the lower main body layer 132 in the vertical direction (the Z direction) with the upper main body layer 136 between the capping layer 138 and the lower main body layer 132. The thickness of the capping layer 138 in the vertical direction (the Z direction) may be selected from a range from about 0.1 nm to about 10 nm but is not limited thereto.

In example embodiments, the capping layer 138 may be formed of an undoped Si layer. In example embodiments, the capping layer 138 may be an Si layer doped with a p-type dopant selected from B and Ga. For example, the capping layer 138 may be an Si layer doped with B. The capping layer 138 may not include Ge.

The capping layer 138 may protect the lower main body layer 132 and the upper main body layer 136. For example, the capping layer 138 may prevent an external chemical material or an external impact from being transferred to the lower main body layer 132 and the upper main body layer 136. Each of the protective insulating film 142 and the intergate insulating film 144 may be separated from the upper main body layer 136 in the vertical direction (the Z direction) with the capping layer 138 therebetween.

Figure 5:
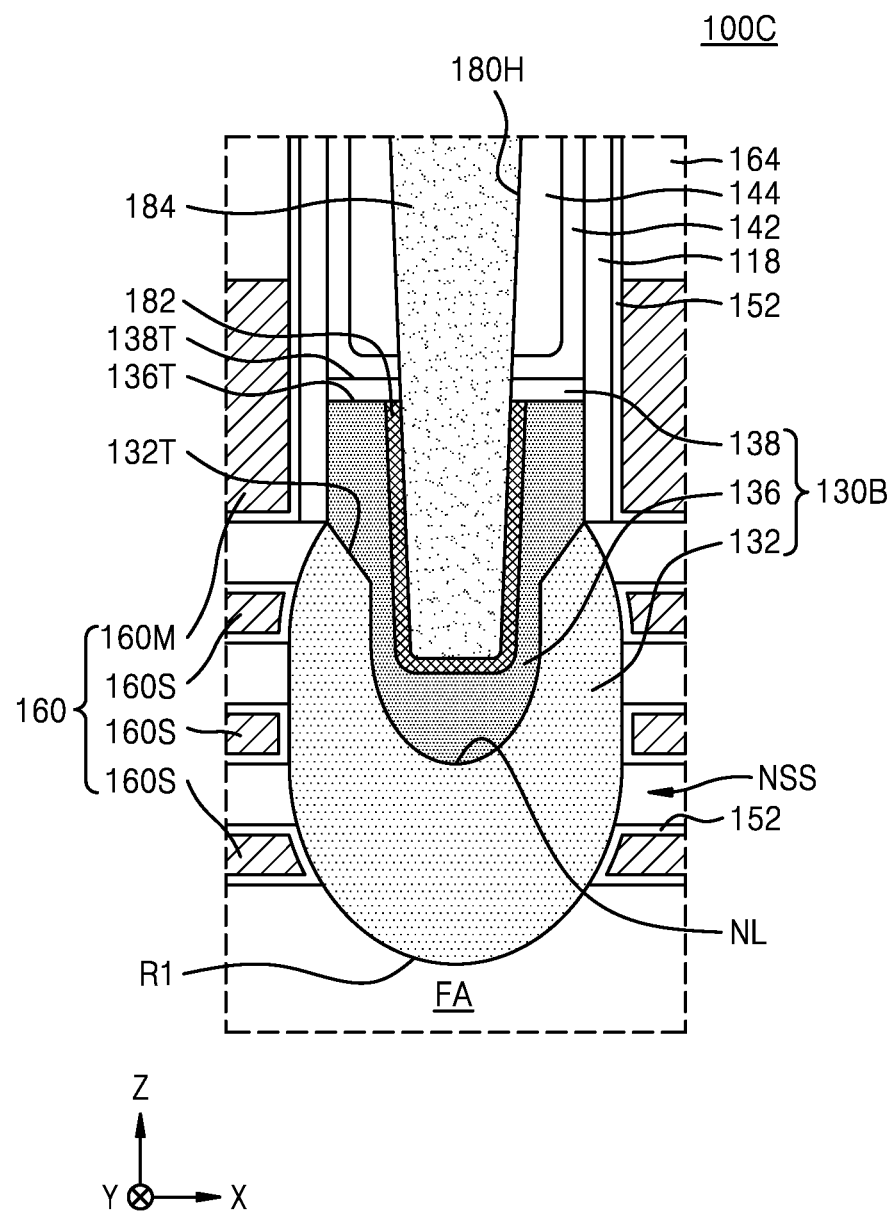
FIG. 5 is a cross-sectional view of an integrated circuit device according to some embodiments.

FIG. 5 is a cross-sectional view of an integrated circuit device 100C according to some embodiments. FIG. 5 illustrates a partial configuration of the portion corresponding to the cross-section taken along the line X-X' in FIG. 1.

Referring to FIG. 5, the integrated circuit device 100C may have substantially the same configuration as the integrated circuit device 100B described with reference to FIG. 4. However, the integrated circuit device 100C may further include the source/drain contact 184 on the source/drain region 130B. The metal silicide film 182 may be between the source/drain region 130B and the source/drain contact 184. The source/drain contact 184 may fill the contact hole 180H, which passes through the intergate insulating film 144 and the protective insulating film 142 in the vertical direction (the Z direction) and extends inside the source/drain region 130B. The source/drain region 130B may be separated from the source/drain contact 184 with the metal silicide film 182 between the source/drain region 130B and the source/drain contact 184. The source/drain region 130B may be outside the contact hole 180H and surround a lower portion of the source/drain contact 184. The detailed configuration of the metal silicide film 182 and the source/drain contact 184 may be the same as that described above with reference to FIGS. 3A and 3B.

Figure 6:
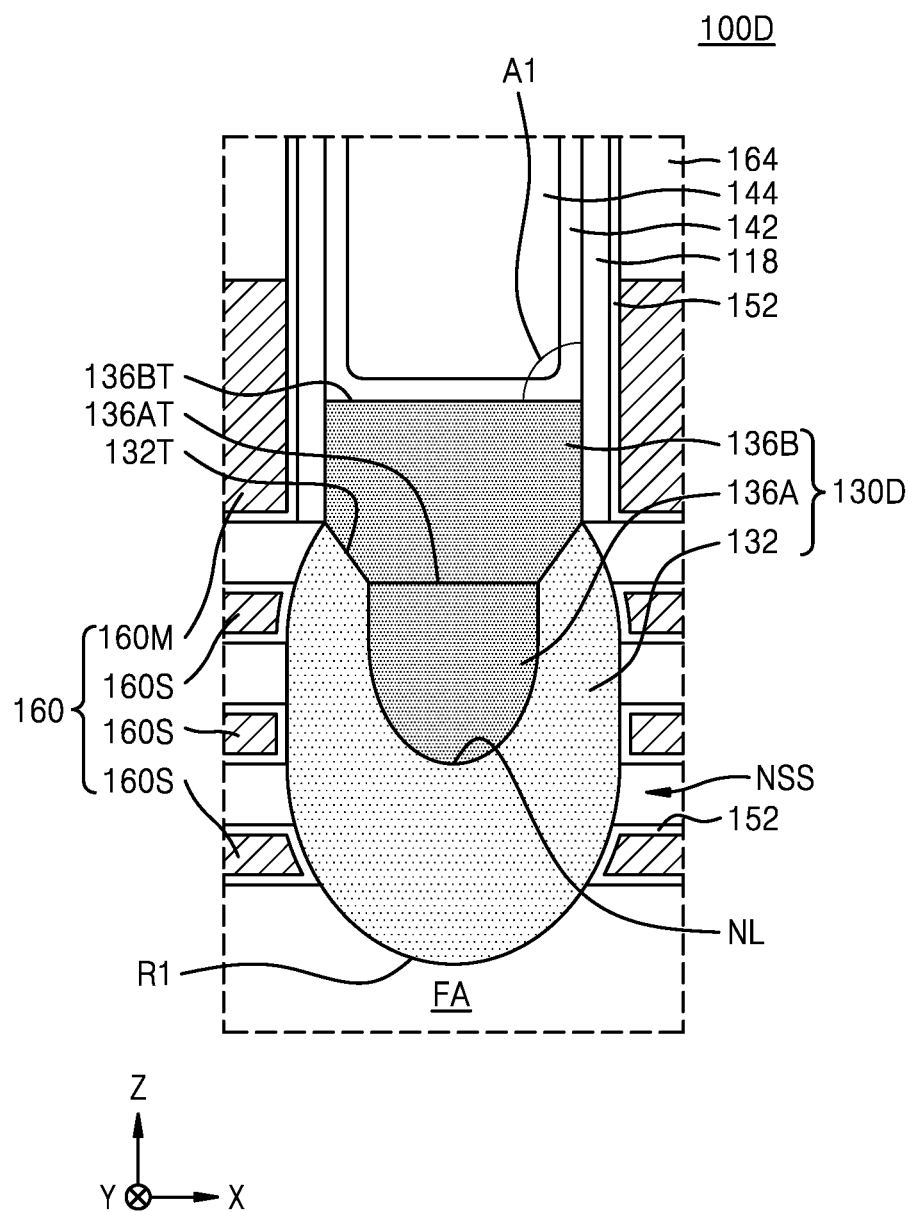
FIG. 6 is a cross-sectional view of an integrated circuit device according to some embodiments.

FIG. 6 is a cross-sectional view of an integrated circuit device 100D according to some embodiments. FIG. 6 illustrates a partial configuration of the portion corresponding to the cross-section taken along the line X-X' in FIG. 1.

Referring to FIG. 6, the integrated circuit device 100D may have substantially the same configuration as the integrated circuit device 100 described with reference to FIGS. 1, 2A and 2B. However, the integrated circuit device 100D may include a source/drain region 130D instead of the source/drain region 130. The source/drain region 130D may have substantially the same configuration as the source/drain region 130 described with reference to FIGS. 1, 2A and 2B. However, the source/drain region 130D includes upper main body layers instead of the upper main body layer 136.

The upper main body layers may include a first upper main body layer 136A and a second upper main body layer 136B, which are sequentially stacked on the lower main body layer 132 in the vertical direction (the Z direction). Each of the first and second upper main body layers 136A and 136B may include a top surface. With respect to the vertical cross section of FIG. 6, each lower facet 132T extends along a corresponding first line and each top surface of the of each of the first and second upper main body layers 136A and 136B has a facet that extends along a corresponding second line, where each of these first lines intersects each of these second lines. In example embodiments, the top surface of the first upper main body layer 136A may include a first facet 136AT having the {100} surface orientation, and the top surface of the second upper main body layer 136B may include a second facet 136BT having the {100} surface orientation. The bottom surface of the second upper main body layer 136B may be in contact with the lower facets 132T of the lower main body layer 132 and the first facet 136AT of the first upper main body layer 136A. The angle A1 between the second facet 136BT of the second upper main body layer 136B of the source/drain region 130D and the side wall of the outer insulating spacer 118, which abut on each other, may be about 90 degrees.

In example embodiments, each of the first and second upper main body layers 136A and 136B may be an $Si_{1-x}Ge_x$ layer doped with a p-type dopant (where $0.3 \leq x < 0.7$) but is not limited thereto. The Ge concentration in the first upper main body layer 136A may be the same as or different from the Ge concentration in the second upper main body layer 136B. For example, the Ge concentration in the second upper main body layer 136B may be greater than the Ge concentration in the first upper main body layer 136A.

Figure 7:
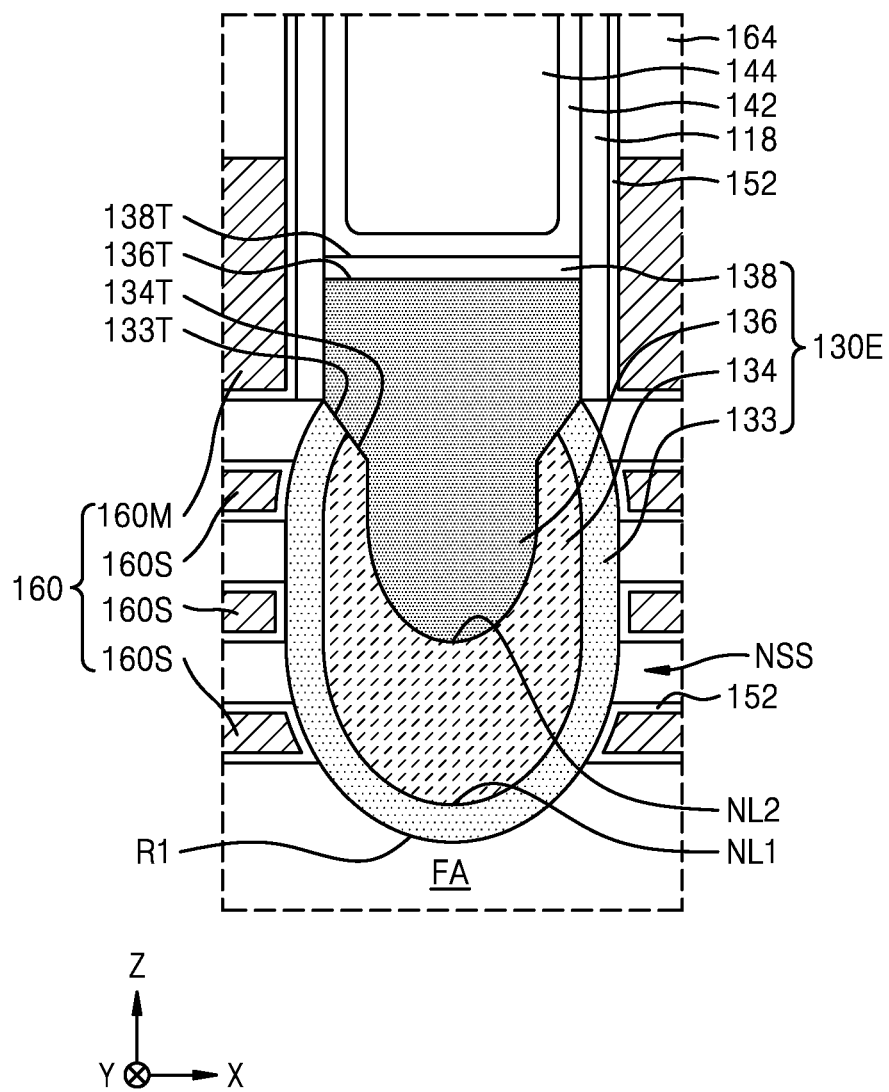
FIG. 7 is a cross-sectional view of an integrated circuit device according to some embodiments.

FIG. 7 is a cross-sectional view of an integrated circuit device 100E according to some embodiments. FIG. 7 illustrates a partial configuration of the portion corresponding to the cross-section taken along the line X-X' in FIG. 1.

Referring to FIG. 7, the integrated circuit device 100E may have substantially the same configuration as the integrated circuit device 100B described with reference to FIG. 4. However, the integrated circuit device 100E may include a source/drain region 130E instead of the source/drain region 130B. The source/drain region 130E may have substantially the same configuration as the source/drain region 130B described with reference to FIG. 4. However, the source/drain region 130E may be formed of several different lower main body layers instead of the lower main body layer 132 (which may be a single homogenous layer).

The lower main body layers may include a first lower main body layer 133 and a second lower main body layer 134, which are sequentially stacked on the fin-type active region FA in the vertical direction (the Z direction). Each of the first lower main body layer 133 and second lower main body layer 134 may be a single homogenous layer. The first lower main body layer 133 may include a pair of first lower facets 133T, which are in contact with the upper main body layer 136, and a first non-linear top surface NL1, which is in contact with the bottom surface of the second lower main body layer 134. The second lower main body layer 134 may include a pair of second lower facets 134T, which are in contact with the upper main body layer 136, and a second non-linear top surface NL2, which is in contact with the bottom surface of the upper main body layer 136. A first lower facet 133T and a second lower facet 134T may abut each other may extend in the same direction on one plane (may lie within the same plane). In example embodiments, each of the first lower facets 133T and the second lower facets 134T may have the {111} surface orientation.

Figure 8:
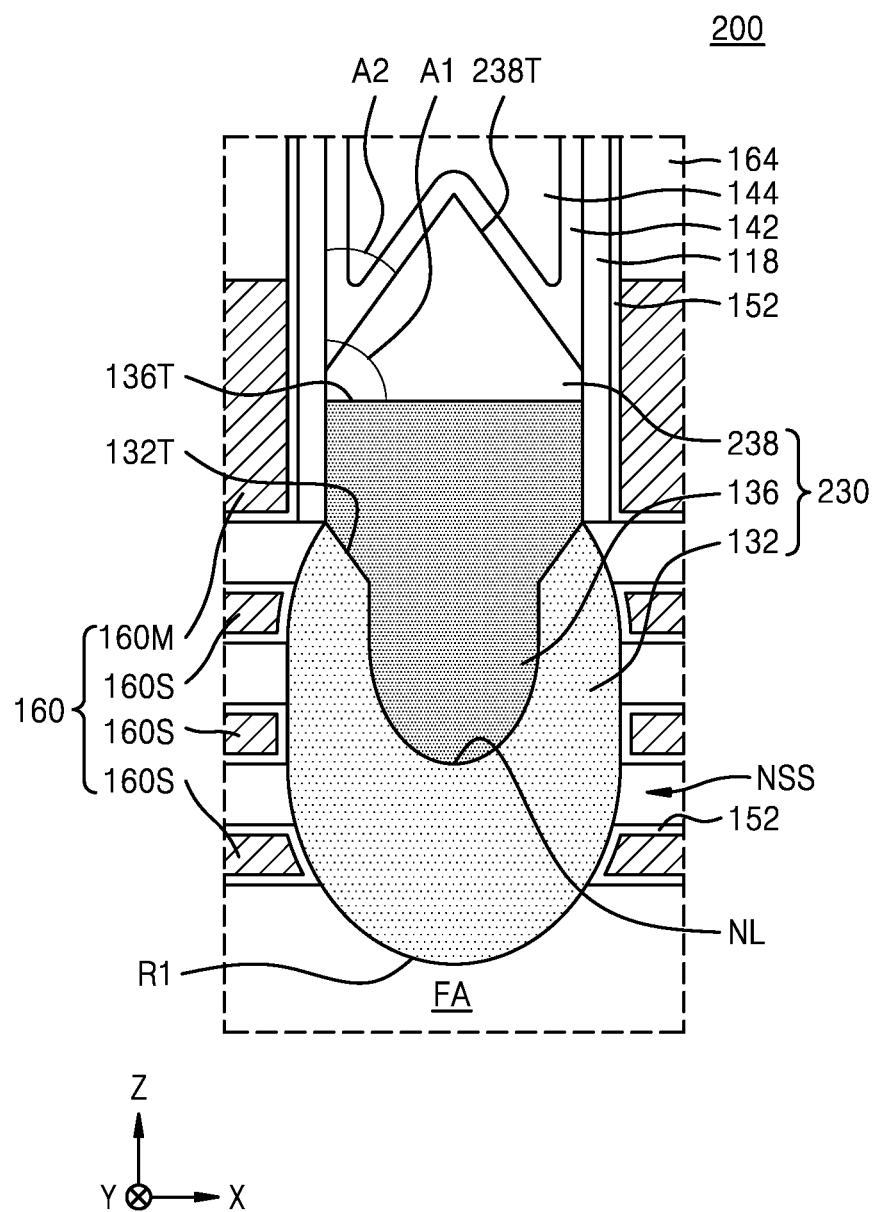
FIG. 8 is a cross-sectional view of an integrated circuit device according to some embodiments.

FIG. 8 is a cross-sectional view of an integrated circuit device 200 according to some embodiments. FIG. 8 illustrates a partial configuration of the portion corresponding to the cross-section taken along the line X-X' in FIG. 1.

Referring to FIG. 8, the integrated circuit device 200 may have substantially the same configuration as the integrated circuit device 100 described with reference to FIGS. 1, 2A and 2B. However, the integrated circuit device 200 may include a source/drain region 230 instead of the source/drain region 130. The source/drain region 230 may have substantially the same configuration as the source/drain region 130 described with reference to FIGS. 1, 2A and 2B. However, the source/drain region 230 may further include a capping layer 238 contacting the upper facet 136T of the upper main body layer 136.

The capping layer 238 may include a portion, of which the thickness in the vertical direction (the Z direction) increases away from the outer insulating spacer 118 in the first horizontal direction (the X direction), wherein the outer insulating spacer 118 is in contact with the capping layer 238. The top surface of the capping layer 238 may include a pair of capping facets 238T. One of the capping facets 238T may extend in the same direction as one of the lower facets 132T of the lower main body layer 132. Each of the capping facets 238T may extend in a direction, which intersects with the direction of the upper facet 136T. Each of the capping facets 238T may have the {111} surface orientation.

The capping layer 238 of the source/drain region 230 may be at a higher level than the topmost level of the nanosheet stack NSS in the vertical direction (the Z direction) and cover the top surface of the upper main body layer 136. The capping layer 238 may be separated from the lower main body layer 132 in the vertical direction (the Z direction) with the upper main body layer 136 between the capping layer 238 and the lower main body layer 132. The thickness of the capping layer 238 in the vertical direction (the Z direction) may be selected from a range from about 0.1 nm to about 10 nm but is not limited thereto.

The angle A1 between the upper facet 136T of the upper main body layer 136 of the source/drain region 230 and the side wall of the outer insulating spacer 118, which abut on each other, may be about 90 degrees. An angle A2 between each of the capping facets 238T of the capping layer 238 and the side wall of an outer insulating spacer 118, which abut on each other, may be about 54 degrees to about 55 degrees.

The capping facets 238T may meet each other at the center of a region between a pair of gate lines 160, which are adjacent to the source/drain region 230 respectively at opposite sides of the source/drain region 230, in the first horizontal direction (the X direction). The protective insulating film 142 may conformally cover the capping facets 238T of the capping layer 238. The material and function of the capping layer 238 may be the same as those of the capping layer 138 described with reference to FIG. 4.

Figure 9:
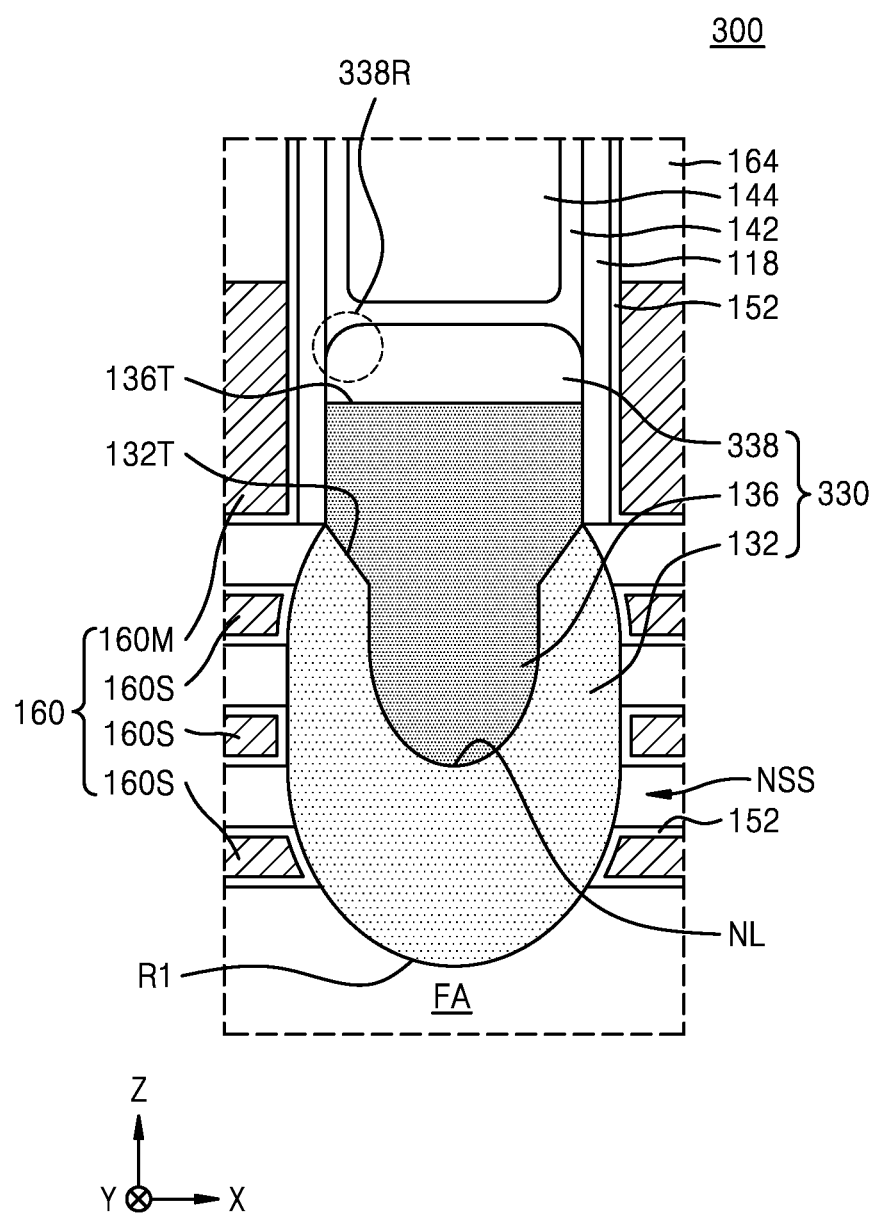
FIG. 9 is a cross-sectional view of an integrated circuit device according to some embodiments.

FIG. 9 is a cross-sectional view of an integrated circuit device 300 according to some embodiments. FIG. 9 illustrates a partial configuration of the portion corresponding to the cross-section taken along the line X-X' in FIG. 1.

Referring to FIG. 9, the integrated circuit device 300 may have substantially the same configuration as the integrated circuit device 100 described with reference to FIGS. 1, 2A and 2B. However, the integrated circuit device 300 may include a source/drain region 330 instead of the source/drain region 130. The source/drain region 330 may have substantially the same configuration as the source/drain region 130 described with reference to FIGS. 1, 2A and 2B. However, the source/drain region 330 may further include a capping layer 338 contacting the upper facet 136T of the upper main body layer 136.

The capping layer 338 may be in contact with an outer insulating spacer 118 adjacent to the source/drain region 330. The top surface of the capping layer 338 may include a non-linear surface portion 338R adjacent to the outer insulating spacer 118. The non-linear surface portion 338R of the capping layer 338 may include a plurality of planes having different slopes from each other. The slopes of the planes of the non-linear surface portion 338R may decrease away in the first horizontal direction (the X direction) from the side wall of the outer insulating spacer 118. The detailed configuration of the capping layer 338 may be the same as that of the capping layer 138 described above with reference to FIG. 4.

Figure 10A:
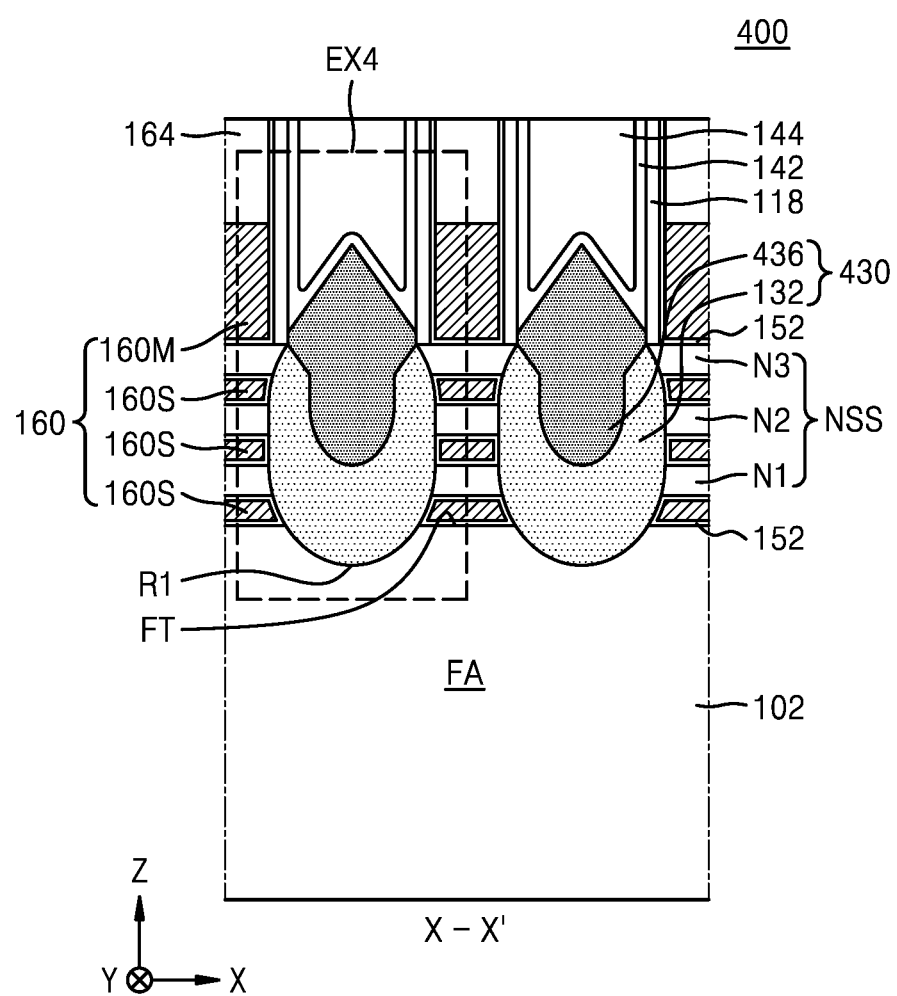
FIGS. 10A and 10B are cross-sectional views of an integrated circuit device according to some embodiments.
Figure 10B:
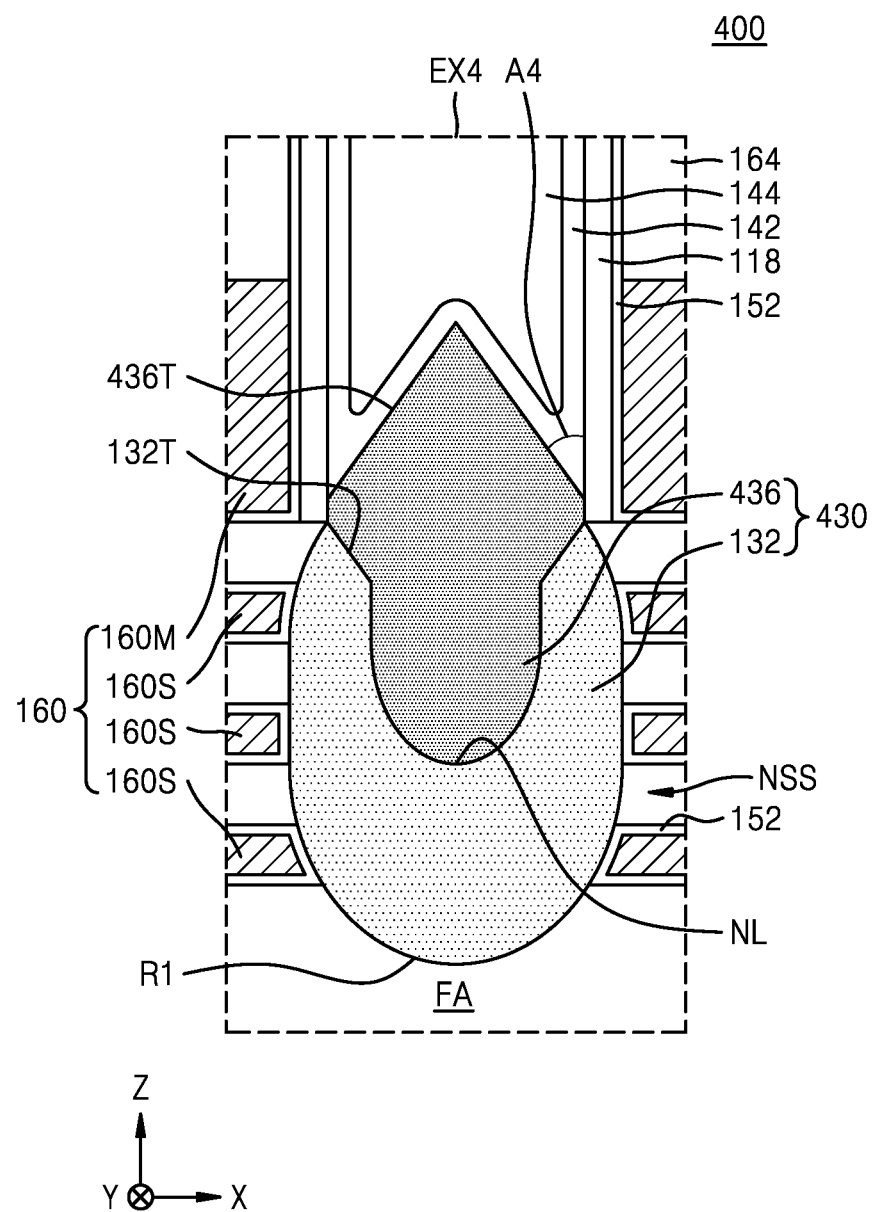

FIGS. 10A and 10B are cross-sectional views of an integrated circuit device 400 according to some embodiments. FIG. 10A illustrates a partial configuration of the portion corresponding to the cross-section taken along the line X-X' in FIG. 1. FIG. 10B is an enlarged cross-sectional view of a partial region EX4 in FIG. 10A.

Referring to FIGS. 10A and 10B, the integrated circuit device 400 may have substantially the same configuration as the integrated circuit device 100 described with reference to FIGS. 1, 2A and 2B. However, the integrated circuit device 400 may include a source/drain region 430 instead of the source/drain region 130. The source/drain region 430 may have substantially the same configuration as the source/drain region 130 described with reference to FIGS. 1, 2A and 2B. However, the source/drain region 430 may include an upper main body layer 436 instead of the upper main body layer 136.

The upper main body layer 436 may include the bottom surface, which is in contact with the lower facets 132T and the non-linear top surface NL of the lower main body layer 132, and a top surface separated from the lower main body layer 132 in the vertical direction (the Z direction). The upper main body layer 436 may include a portion contacting the side wall of the outer insulating spacer 118.

The top surface of the upper main body layer 436 may include a pair of upper facets 436T. One of the upper facets 436T may extend in a direction, which intersects with the direction of one of the lower facets 132T of the lower main body layer 132. The other one of the upper facets 436T may extend in the same direction as one of the lower facets 132T of the lower main body layer 132. Each of the upper facets 436T may have the {111} surface orientation. An angle A4 between the upper facet 436T of the upper main body layer 436 of the source/drain region 430 and the side wall of the outer insulating spacer 118, which abut on each other, may be about 54 degrees to about 55 degrees. The upper facets 436T may meet each other at the center of a region between a pair of gate lines 160, which are adjacent to the source/drain region 430 respectively at opposite sides of the source/drain region 430, in the first horizontal direction (the X direction). The protective insulating film 142 may conformally cover the upper facets 436T.

The detailed configuration of the upper main body layer 436 may be the same as that of the upper main body layer 136 described above with reference to FIGS. 1, 2A and 2B.

Figure 11A:
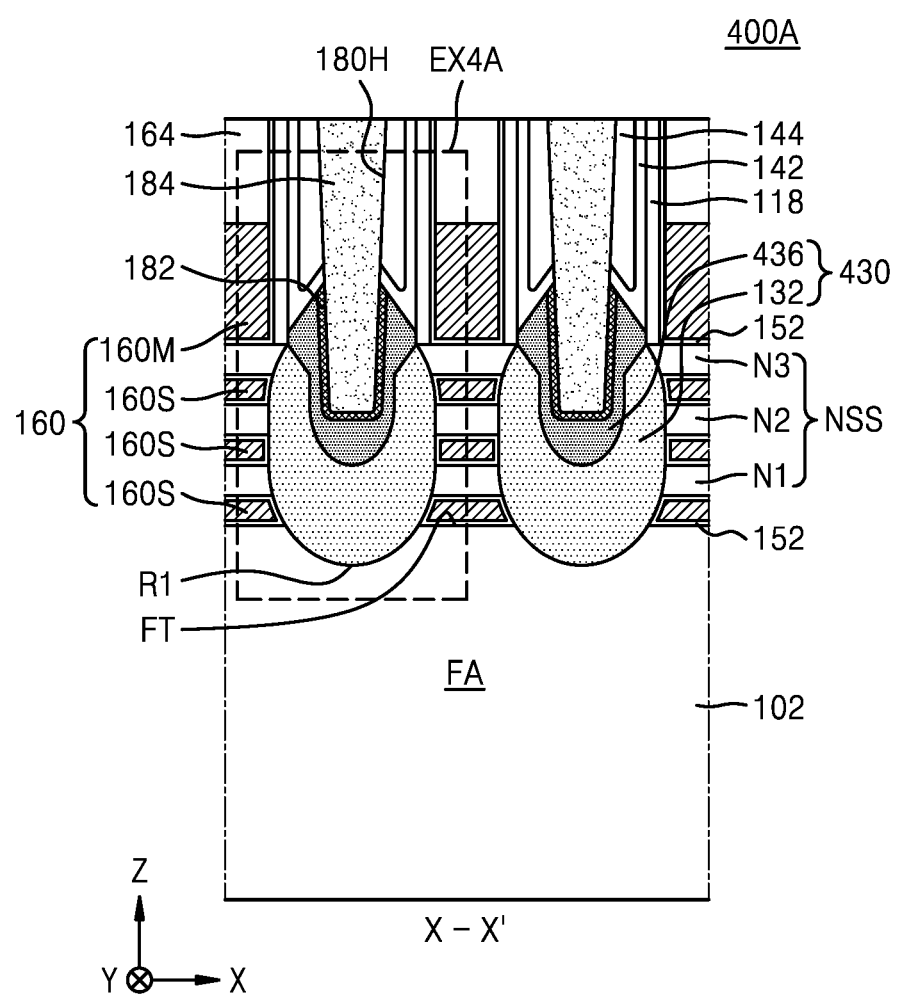
FIGS. 11A and 11B are cross-sectional views of an integrated circuit device according to some embodiments.
Figure 11B:
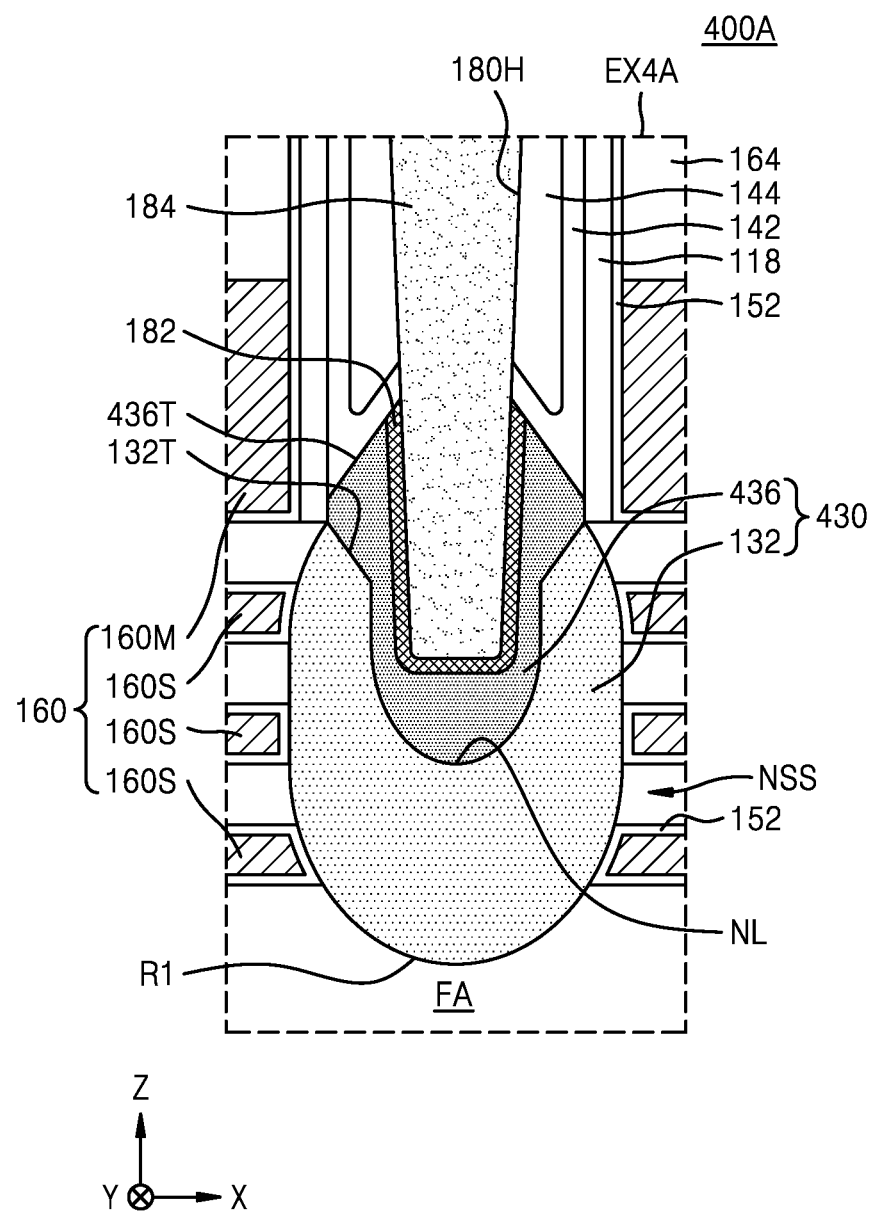

FIGS. 11A and 11B are cross-sectional views of an integrated circuit device 400A according to some embodiments. FIG. 11A illustrates a partial configuration of the portion corresponding to the cross-section taken along the line X-X' in FIG. 1. FIG. 11B is an enlarged cross-sectional view of a partial region EX4A in FIG. 11A.

Referring to FIGS. 11A and 11B, the integrated circuit device 400A may have substantially the same configuration as the integrated circuit device 400 described with reference to FIGS. 10A and 10B. However, the integrated circuit device 400A may include a plurality of source/drain contacts 184 on a plurality of source/drain regions 430. The metal silicide film 182 may be between a source/drain region 430 and a source/drain contact 184. Each source/drain contact 184 may fill the contact hole 180H, which passes through the intergate insulating film 144 and the protective insulating film 142 in the vertical direction (the Z direction) and extends inside the source/drain region 430. The source/drain region 430 may be separated from the source/drain contact 184 with the metal silicide film 182 between the source/drain region 430 and the source/drain contact 184. The source/drain region 430 may be outside the contact hole 180H and surround a lower portion of the source/drain contact 184. Each of the upper facets 436T of the upper main body layer 436 of the source/drain region 430 may extend to slant from an outer insulating spacer 118 to the source/drain contact 184 in a direction away from the substrate 102.

The detailed configuration of the metal silicide film 182 and the source/drain contact 184 may be the same as that described above with reference to FIGS. 3A and 3B.

Figure 12:
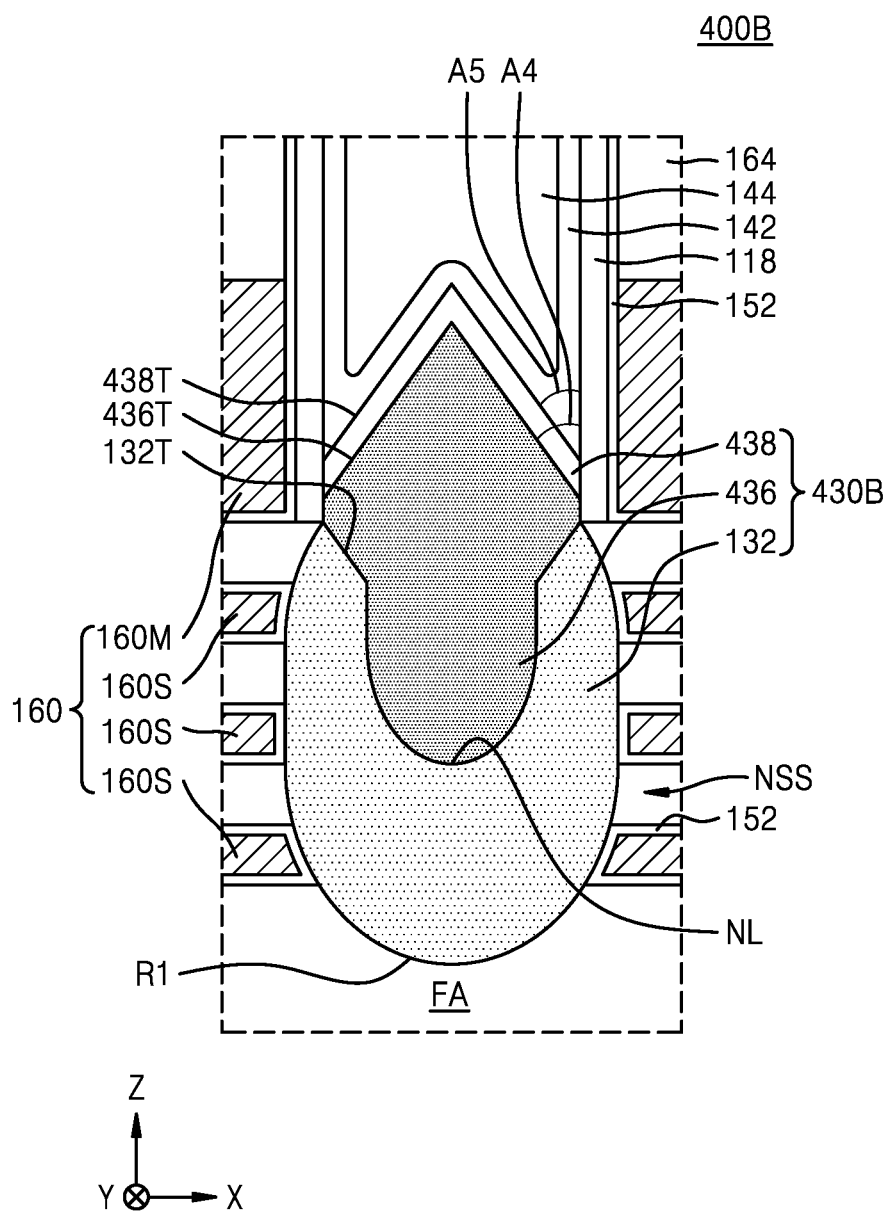
FIG. 12 is a cross-sectional view of an integrated circuit device according to some embodiments.

FIG. 12 is a cross-sectional view of an integrated circuit device 400B according to some embodiments. FIG. 12 illustrates a partial configuration of the portion corresponding to the cross-section taken along the line X-X' in FIG. 1.

Referring to FIG. 12, the integrated circuit device 400B may have substantially the same configuration as the integrated circuit device 400 described with reference to FIGS. 10A and 10B. However, the integrated circuit device 400B may include a source/drain region 430B instead of the source/drain region 430. The source/drain region 430B may have substantially the same configuration as the source/drain region 430 described with reference to FIGS. 10A and 10B. However, the source/drain region 430B may further include a capping layer 438 contacting upper facets 436T of the upper main body layer 436.

The capping layer 438 may conformally cover the upper facets 436T. The top surface of the capping layer 438 may include a pair of capping facets 438T, which extend in the same direction as the upper facets 436T.

One of the capping facets 438T may extend in the same direction as one of the lower facets 132T of the lower main body layer 132. With respect to the vertical cross section of FIG. 12, each lower facet 132T may extend along a corresponding first line and each capping facet 438T may extend along a corresponding second line, where each first line may intersect one of these second lines.

The capping facets 438T may be at different vertical levels from the upper facets 436T and may extend in a direction intersecting with the first horizontal direction (the X direction) to be parallel with the upper facets 436T. In example embodiments, each of the capping facets 438T may have the {111} surface orientation.

The capping layer 438 of the source/drain region 430B may be at a higher level than the topmost level of the nanosheet stack NSS in the vertical direction (the Z direction) and cover the top surface of the upper main body layer 436. The capping layer 438 may be separated from the lower main body layer 132 in the vertical direction (the Z direction) with the upper main body layer 436 between the capping layer 438 and the lower main body layer 132.

The angle A4 between an upper facet 436T of the upper main body layer 436 and the side wall of the outer insulating spacer 118, which abut on each other, and an angle A5 between a capping facet 438T of the capping layer 438 and the side wall of the outer insulating spacer 118, which abut on each other, may be about 54 degrees to about 55 degrees.

A pair of capping facets 438T may meet each other at the center of a region between a pair of gate lines 160, which are adjacent to the source/drain region 430B respectively at opposite sides of the source/drain region 430B, in the first horizontal direction (the X direction). The protective insulating film 142 may conformally cover the capping facets 438T of the capping layer 438. The material and function of the capping layer 438 may be the same as those of the capping layer 138 described with reference to FIG. 4.

Figure 13:
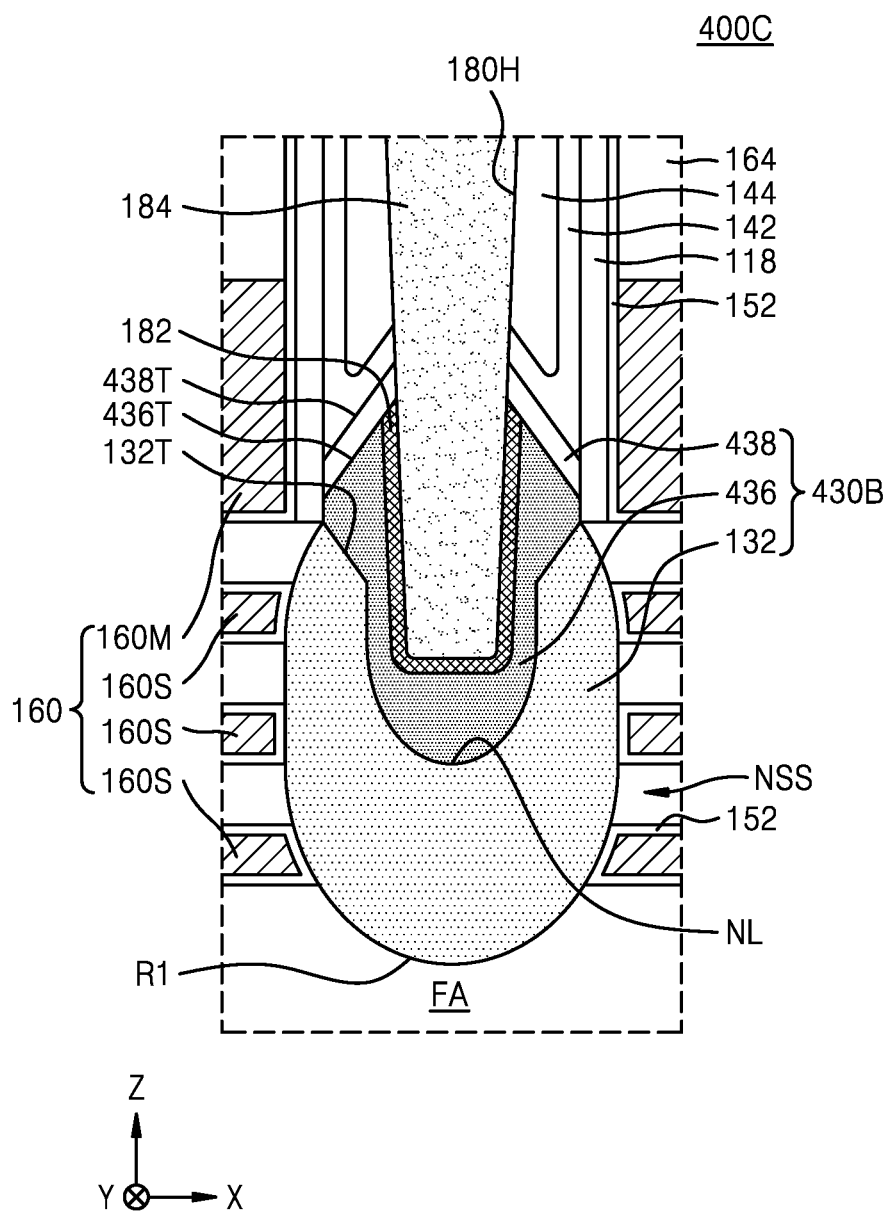
FIG. 13 is a cross-sectional view of an integrated circuit device according to some embodiments.

FIG. 13 is a cross-sectional view of an integrated circuit device 400C according to some embodiments. FIG. 13 illustrates a partial configuration of the portion corresponding to the cross-section taken along the line X-X' in FIG. 1.

Referring to FIG. 13, the integrated circuit device 400C may have substantially the same configuration as the integrated circuit device 400B described with reference to FIG. 12. However, the integrated circuit device 400C may include the source/drain contact 184 on the source/drain region 430B. The metal silicide film 182 may be between the source/drain region 430B and the source/drain contact 184. The source/drain contact 184 may fill the contact hole 180H, which passes through the intergate insulating film 144 and the protective insulating film 142 in the vertical direction (the Z direction) and extends inside the source/drain region 430B. The source/drain region 430B may be separated from the source/drain contact 184 with the metal silicide film 182 between the source/drain region 430B and the source/drain contact 184. The source/drain region 430B may be outside the contact hole 180H and surround a lower portion of the source/drain contact 184. The detailed configuration of the metal silicide film 182 and the source/drain contact 184 may be the same as that described above with reference to FIGS. 3A and 3B.

Figure 14:
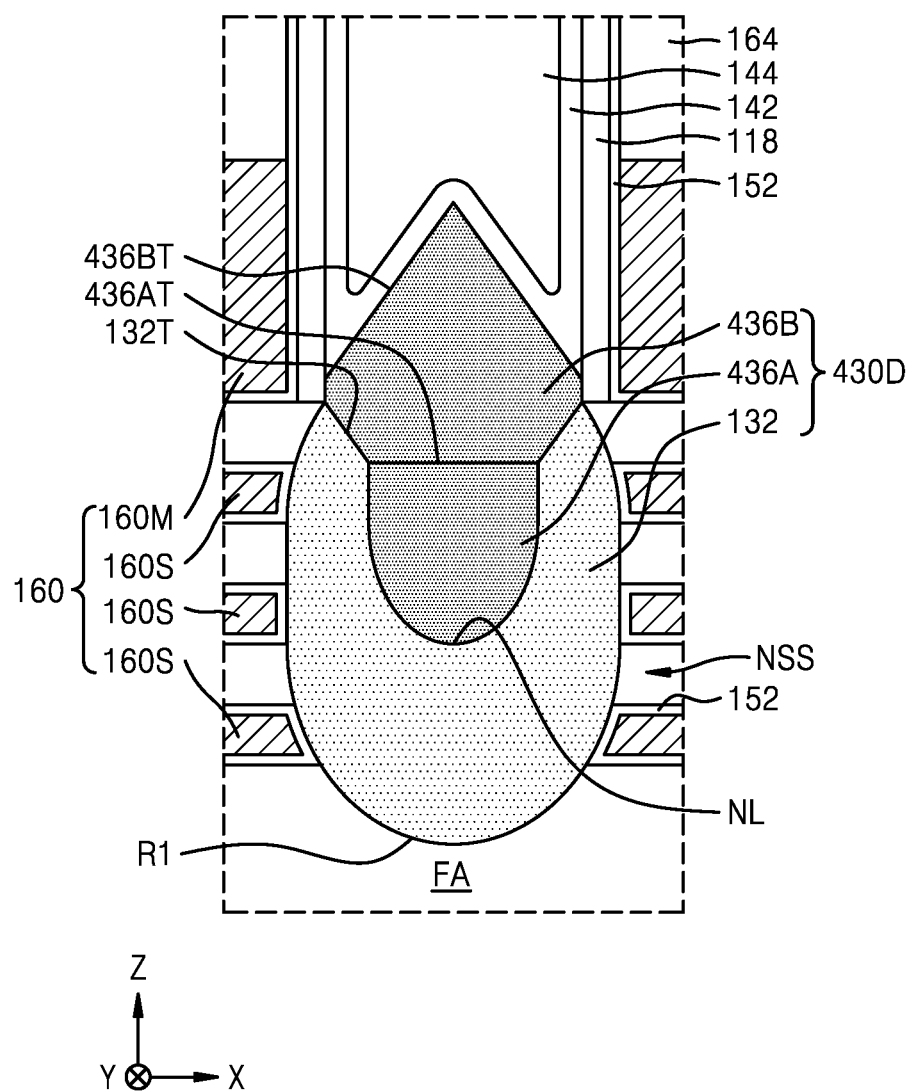
FIG. 14 is a cross-sectional view of an integrated circuit device according to some embodiments.

FIG. 14 is a cross-sectional view of an integrated circuit device 400D according to some embodiments. FIG. 14 illustrates a partial configuration of the portion corresponding to the cross-section taken along the line X-X' in FIG. 1.

Referring to FIG. 14, the integrated circuit device 400D may have substantially the same configuration as the integrated circuit device 400 described with reference to FIGS. 10A and 10B. However, the integrated circuit device 400D may include a source/drain region 430D instead of the source/drain region 430. The source/drain region 430D may have substantially the same configuration as the source/drain region 430 described with reference to FIGS. 10A and 10B. However, the source/drain region 430D includes upper main body layers instead of the upper main body layer 436.

The upper main body layers may include a first upper main body layer 436A and a second upper main body layer 436B, which are sequentially stacked on the lower main body layer 132 in the vertical direction (the Z direction).

Each of the first and second upper main body layers 436A and 436B may include a top surface. With respect to the vertical cross section of FIG. 14, each of the lower facets extends along a corresponding first line, and the top surface of the first upper main body layer 436A has a facet that extends along a second line, where each of these first lines intersects with this second line. In addition, the top surface of the second upper main body layer 436B has a top surface including facets that extend along corresponding third lines, where each first line intersects with one third line and is parallel with the other third line. In example embodiments, the top surface of the first upper main body layer 436A may include a first facet 436AT having the {100} surface orientation, and the top surface of the second upper main body layer 436B may include a pair of second facets 436BT having the {111} surface orientation. The bottom surface of the second upper main body layer 436B may be in contact with the lower facets 132T of the lower main body layer 132 and the first facet 436AT of the first upper main body layer 436A.

In example embodiments, each of the first and second upper main body layers 436A and 436B may include an $Si_{1-x}Ge_x$ layer doped with a p-type dopant (where $0.3 \leq x < 0.7$) but is not limited thereto. The Ge concentration in the first upper main body layer 436A may be the same as or different from the Ge concentration in the second upper main body layer 436B. For example, the Ge concentration in the second upper main body layer 436B may be greater than the Ge concentration in the first upper main body layer 436A.

Figure 15:
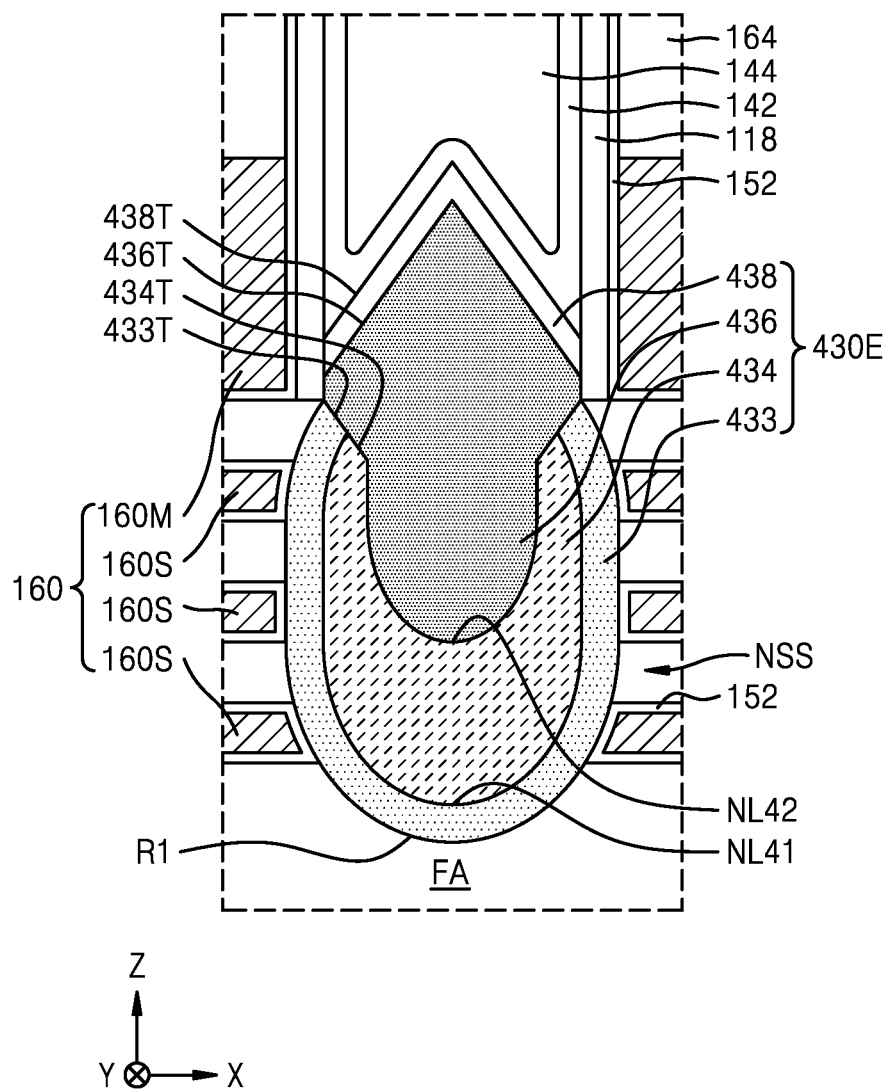
FIG. 15 is a cross-sectional view of an integrated circuit device according to some embodiments.

FIG. 15 is a cross-sectional view of an integrated circuit device 400E according to some embodiments. FIG. 15 illustrates a partial configuration of the portion corresponding to the cross-section taken along the line X-X' in FIG. 1.

Referring to FIG. 15, the integrated circuit device 400E may have substantially the same configuration as the integrated circuit device 400B described with reference to FIG. 12. However, the integrated circuit device 400E may include a source/drain region 430E instead of the source/drain region 430B. The source/drain region 430E may have substantially the same configuration as the source/drain region 430B described with reference to FIG. 12. However, the source/drain region 430E includes lower main body layers instead of the lower main body layer 132.

The lower main body layers may include a first lower main body layer 433 and a second lower main body layer 434, which are sequentially stacked on the fin-type active region FA in the vertical direction (the Z direction). The first lower main body layer 433 may include a pair of first lower facets 433T, which are in contact with the upper main body layer 436, and a first non-linear top surface NL41, which is in contact with the bottom surface of the second lower main body layer 434. The second lower main body layer 434 may include a pair of second lower facets 434T, which are in contact with the upper main body layer 436, and a second non-linear top surface NL42, which is in contact with the bottom surface of the upper main body layer 436. A first lower facet 433T and a second lower facet 434T that are adjacent to each other may extend in the same direction on one plane. In example embodiments, each of the first lower facets 433T and the second lower facets 434T may have the {111} surface orientation.

Figure 16:
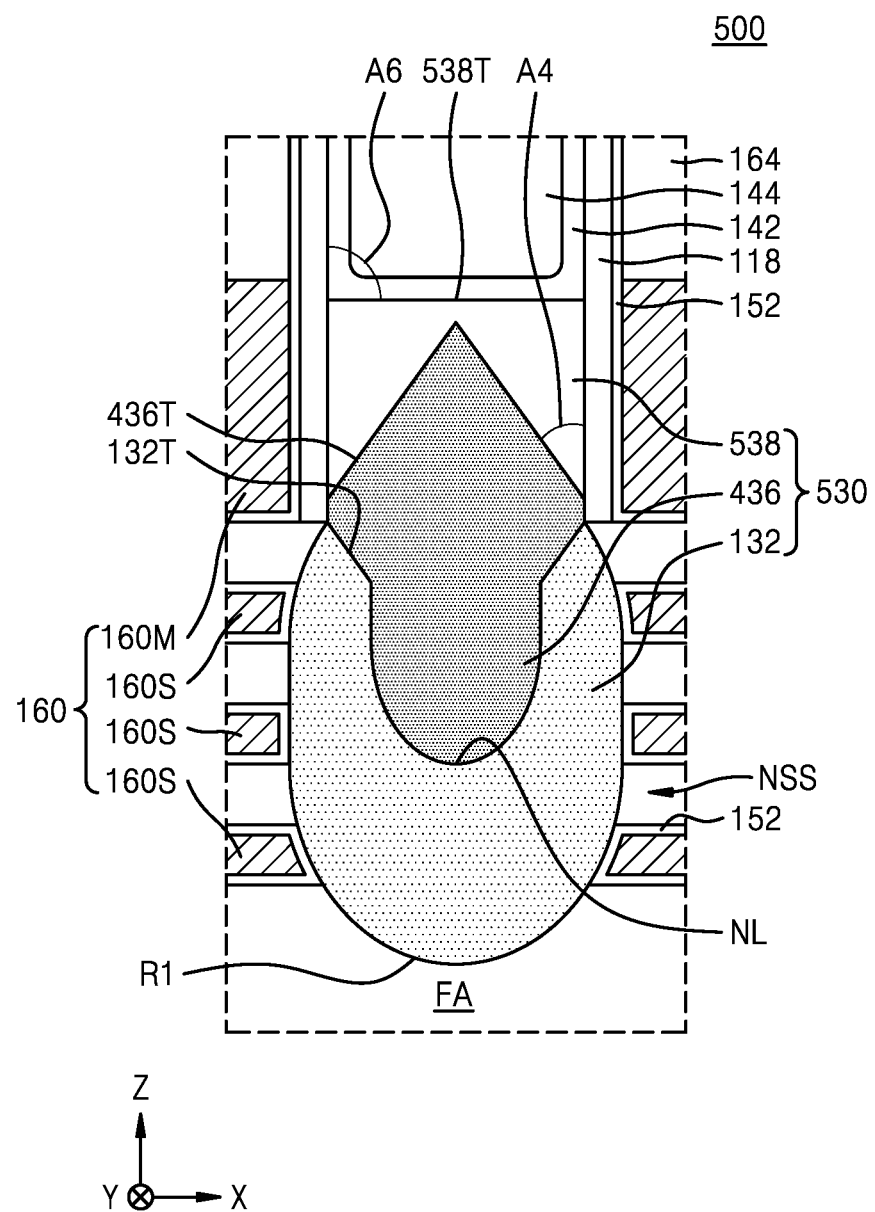
FIG. 16 is a cross-sectional view of an integrated circuit device according to some embodiments.

FIG. 16 is a cross-sectional view of an integrated circuit device 500 according to some embodiments. FIG. 16 illustrates a partial configuration of the portion corresponding to the cross-section taken along the line X-X' in FIG. 1.

Referring to FIG. 16, the integrated circuit device 500 may have substantially the same configuration as the integrated circuit device 400 described with reference to FIGS. 10A and 10B. However, the integrated circuit device 500 may include a source/drain region 530 instead of the source/drain region 430. The source/drain region 530 may have substantially the same configuration as the source/drain region 430 described with reference to FIGS. 10A and 10B. However, the source/drain region 530 may further include a capping layer 538 contacting a pair of upper facets 436T of the upper main body layer 436.

The capping layer 538 may include a portion, of which the thickness in the vertical direction (the Z direction) decreases away from the outer insulating spacer 118 in the first horizontal direction (the X direction), wherein the outer insulating spacer 118 is in contact with the capping layer 538. The top surface of the capping layer 538 may include a capping facet 538T. The capping facet 538T may extend in the first horizontal direction (the X direction). The capping facet 538T may extend in a direction, which intersects with the direction of each of the upper facets 436T. The capping facet 538T may extend in a direction, which intersects with the direction of each of the lower facets 132T of the lower main body layer 132. In example embodiments, the capping facet 538T may have the {100} surface orientation.

The capping layer 538 of the source/drain region 530 may be at a higher level than the topmost level of the nanosheet stack NSS in the vertical direction (the Z direction) and cover the top surface of the upper main body layer 436. The capping layer 538 may be separated from the lower main body layer 132 in the vertical direction (the Z direction) with the upper main body layer 436 between the capping layer 538 and the lower main body layer 132.

The angle A4 between an upper facet 436T of the upper main body layer 436 of the source/drain region 530 and the side wall of the outer insulating spacer 118, which abut on each other, may be about 54 degrees to about 55 degrees. An angle A6 between the capping facet 538T of the capping layer 538 and the side wall of the outer insulating spacer 118, which abut on each other, may be about 90 degrees. The material and function of the capping layer 538 may be the same as those of the capping layer 138 described with reference to FIG. 4.

Figure 17:
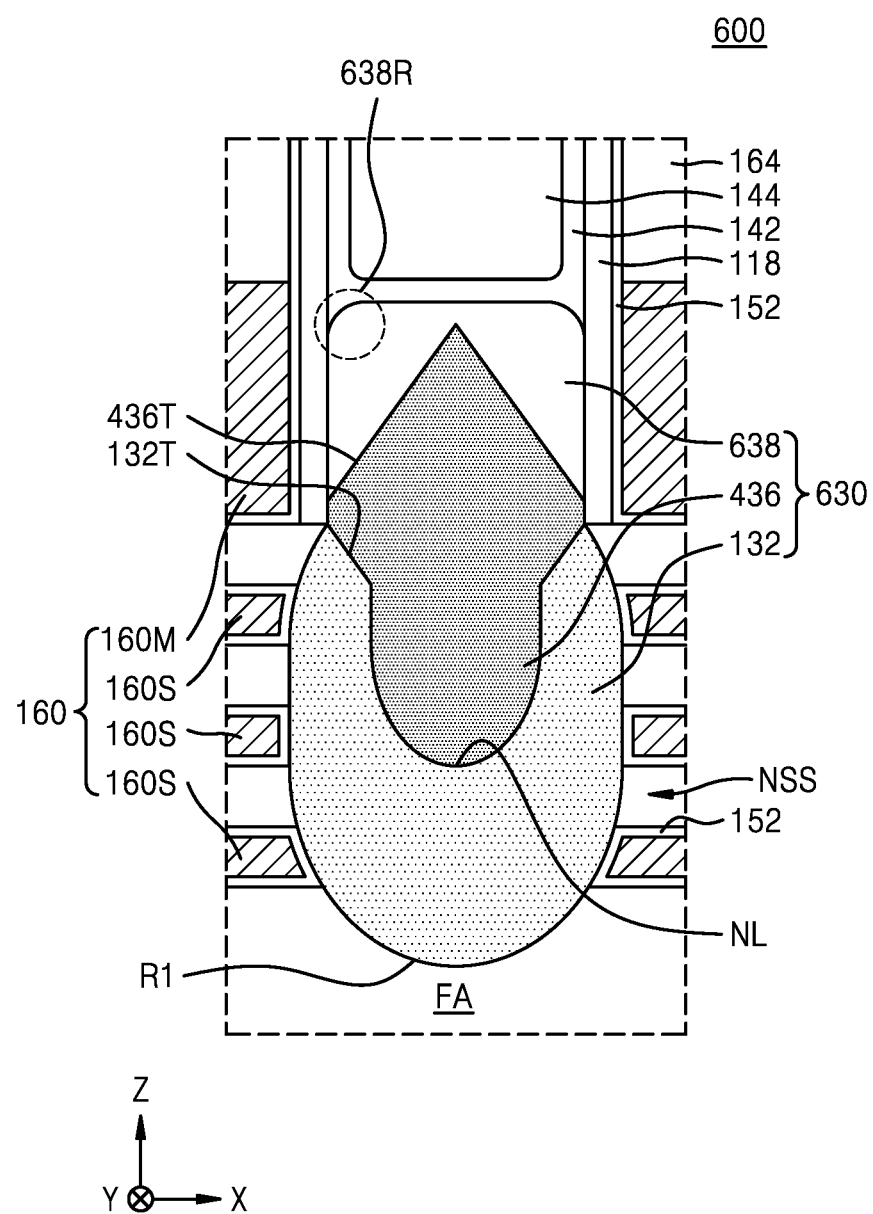
FIG. 17 is a cross-sectional view of an integrated circuit device according to some embodiments.

FIG. 17 is a cross-sectional view of an integrated circuit device 600 according to some embodiments. FIG. 17 illustrates a partial configuration of the portion corresponding to the cross-section taken along the line X-X' in FIG. 1.

Referring to FIG. 17, the integrated circuit device 600 may have substantially the same configuration as the integrated circuit device 400 described with reference to FIGS. 10A and 10B. However, the integrated circuit device 600 may include a source/drain region 630 instead of the source/drain region 430. The source/drain region 630 may have substantially the same configuration as the source/drain region 430 described with reference to FIGS. 10A and 10B. However, the source/drain region 630 may further include a capping layer 638 contacting a pair of upper facets 436T of the upper main body layer 436. The capping layer 638 may be in contact with an outer insulating spacer 118 adjacent to the source/drain region 630. The top surface of the capping layer 638 may include a non-linear surface portion 638R adjacent to the outer insulating spacer 118. The non-linear surface portion 638R of the capping layer 638 may include a plurality of planes having different slopes from each other. The slopes of the planes of the non-linear surface portion 638R may decrease away in the first horizontal direction (the X direction) from a side wall of the outer insulating spacer 118. The detailed configuration of the capping layer 638 may be the same as that of the capping layer 138 described above with reference to FIG. 4.

A source/drain region of each of the integrated circuit devices described with reference to FIGS. 1 through 17 includes a plurality of facets. Accordingly, a plurality of source/drain regions at different positions of a substrate may have uniformly controlled shapes. Therefore, the contact resistance of the source/drain regions may be reduced, and the distribution of electrical characteristics of the source/drain regions may be improved. As a result, the reliability of an integrated circuit device may be increased.

Figure 18:
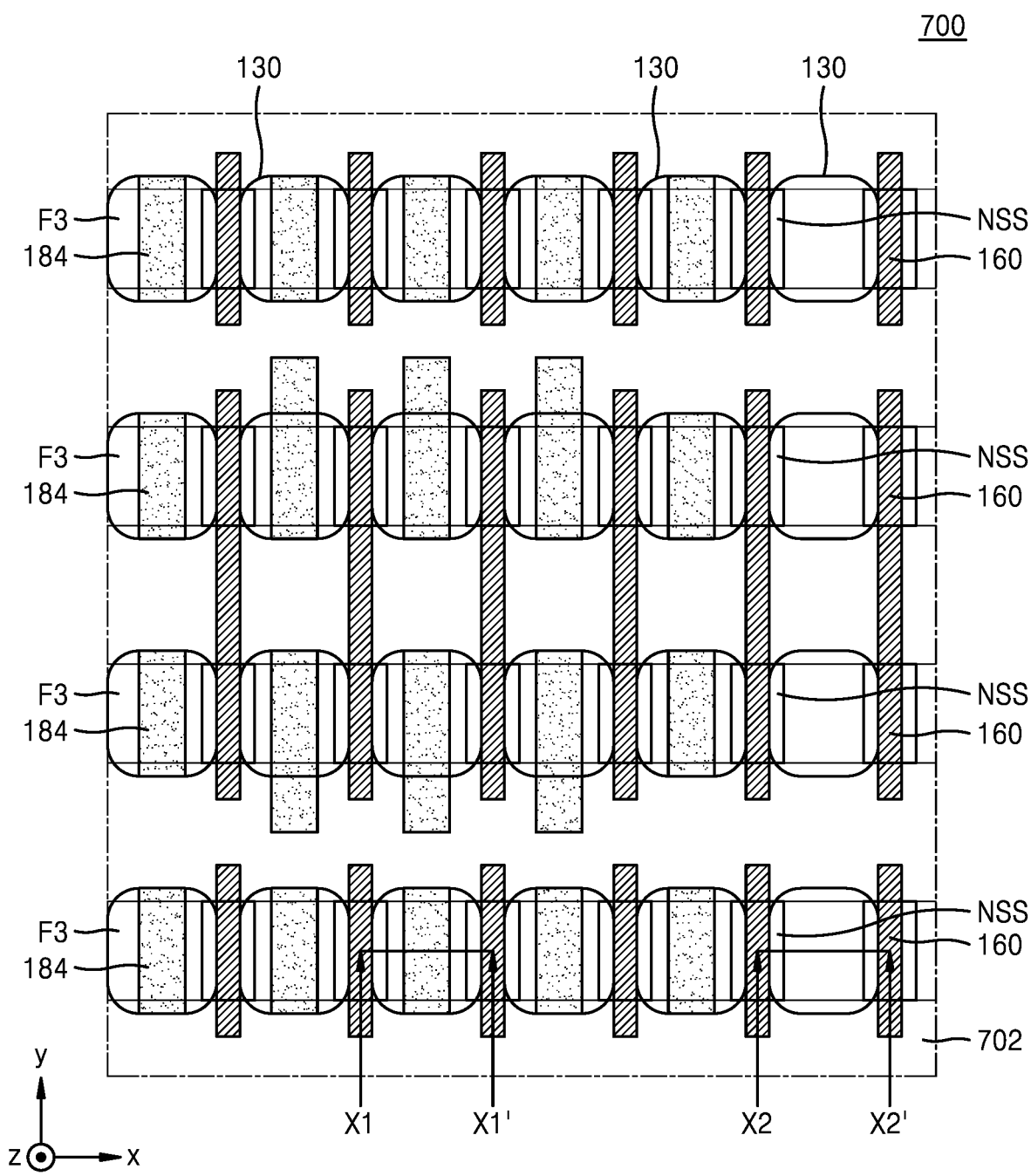
FIG. 18 is a plan view of a layout of an integrated circuit device according to some embodiments.

FIG. 18 is a plan view of a layout of an integrated circuit device 700 according to some embodiments. In FIGS. 1 through 18, like reference characters denote like elements, and redundant descriptions thereof will be omitted.

Referring to FIG. 18, the integrated circuit device 700 may include a plurality of fin-type active regions F3, which protrude from a substrate 702 in the vertical direction (the Z direction) and extend long in the first horizontal direction (the X direction), and a plurality of gate lines 160, which extend long in the second horizontal direction (the Y direction) on the fin-type active regions F3. Each of a plurality of nanosheet stacks NSS may be above the fin top of each of the fin-type active regions F3 at an intersection between a corresponding one of the fin-type active regions F3 and one of the gate lines 160. The detailed configuration of the substrate 702 and the fin-type active regions F3 may be the same as that of the substrate 102 and the fin-type active regions FA described with reference to FIGS. 1, 2A and 2B.

A plurality of source/drain regions 130 may be on the fin-type active regions F3 to be adjacent to the gate lines 160, and a source/drain contact 184 may be on each of some source/drain regions 130 to be connected to a source/drain region 130. The source/drain contact 184 may not be on each of the other source/drain regions 130.

In example embodiments, a cross-section taken along line X1-X1' in FIG. 18 may have one of the configurations described with reference to FIGS. 3B, 5, 111B, and 13. In example embodiments, a cross-section taken along line X2-X2' in FIG. 18 may have one of the configurations described with reference to FIGS. 2B, 4, 6 through 9, 10B, 12, and 14 through 17.

FIGS. 19A through 19J are cross-sectional views of sequential stages in a method of manufacturing an integrated circuit device, according to embodiments. An example method of manufacturing the integrated circuit device 100 of FIGS. 1 through 2A will be described with reference to FIGS. 19A through 19J. In FIGS. 1, 2A and 2B and FIGS. 19A through 19J, like reference characters denote like elements, and redundant descriptions thereof will be omitted.

Figure 19A:
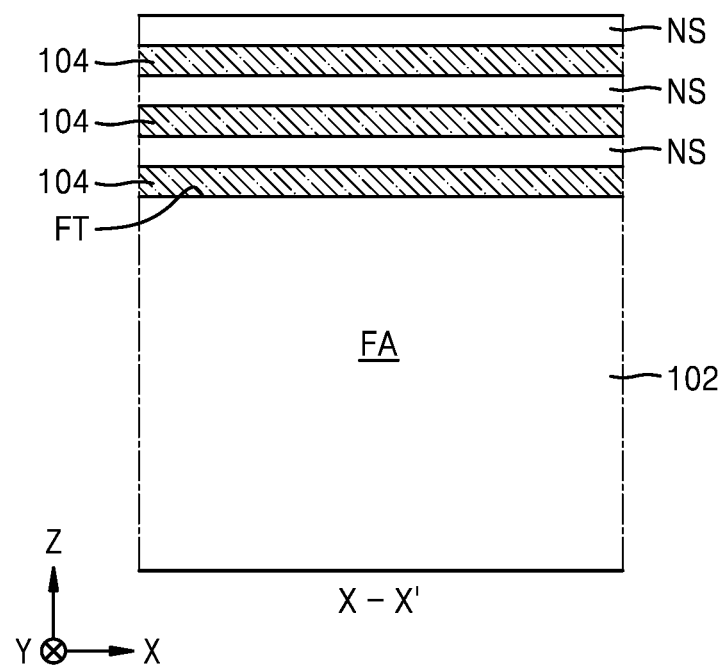
FIGS. 19A through 19J are cross-sectional views of sequential stages in a method of manufacturing an integrated circuit device, according to embodiments.

Referring to FIG. 19A, a plurality of sacrificial semiconductor layers 104 and a plurality of nanosheet semiconductor layers NS may be alternately stacked on the substrate 102. Thereafter, a plurality of fin-type active regions FA may be defined by partially etching each of the sacrificial semiconductor layers 104, the nanosheet semiconductor layers NS, and the substrate 102 Thereafter, the isolation film 114 (see FIG. 1), which covers a side wall of each of the fin-type active regions FA, may be formed. The top surface of the isolation film 114 may be at a level that is the same as or similar to the level of the fin top FT of each of the fin-type active regions FA.

A stack structure of the sacrificial semiconductor layers 104 and the nanosheet semiconductor layers NS may remain on the fin top FT of each of the fin-type active regions FA.

The sacrificial semiconductor layers 104 may include a semiconductor material having a different etch selectivity than a semiconductor material of the nanosheet semiconductor layers NS. In example embodiments, the nanosheet semiconductor layers NS may include an Si layer, and the sacrificial semiconductor layers 104 may include an SiGe layer. In example embodiments, the sacrificial semiconductor layers 104 may have a constant Ge concentration. The SiGe layer of the sacrificial semiconductor layers 104 may have a constant Ge concentration selected from a range from about 5 at % to about 60 at %, e.g., a range from about 10 at % to about 40 at %. The Ge concentration of the SiGe layer of the sacrificial semiconductor layers 104 may be variously changed when necessary.

Figure 19B:
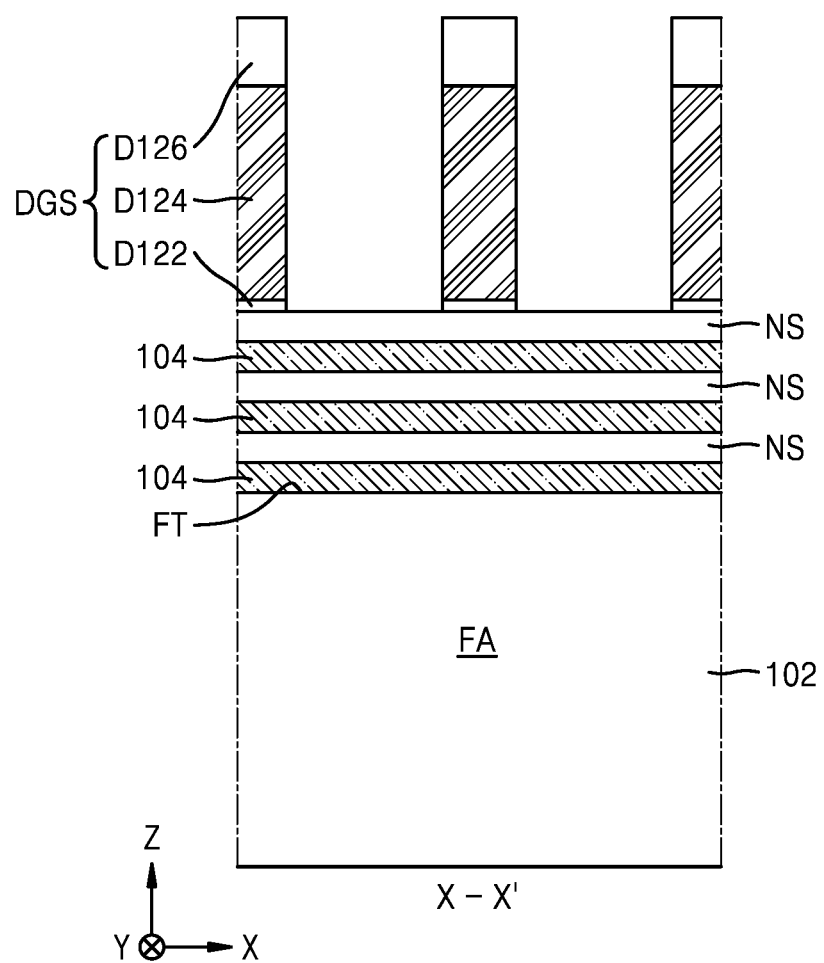

Referring to FIG. 19B, a plurality of dummy gate structures DGS may be formed on the stack structure of the sacrificial semiconductor layers 104 and the nanosheet semiconductor layers NS.

Each of the dummy gate structures DGS may extend long in the second horizontal direction (the Y direction). Each of the dummy gate structures DGS may have a structure, in which an oxide film D122, a dummy gate layer D124, and a capping layer D126 are sequentially stacked. In example embodiments, the dummy gate layer D124 may include a polysilicon film, and the capping layer D126 may include a silicon nitride film.

Figure 19C:
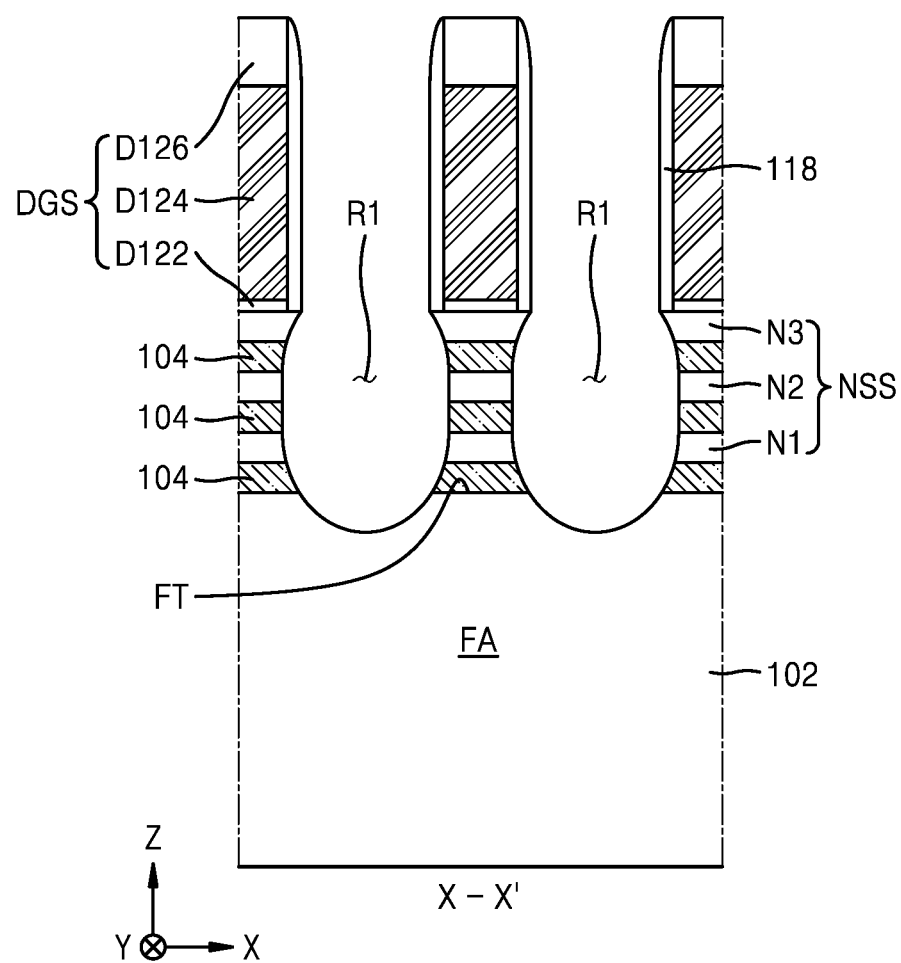

Referring to FIG. 19C, a plurality of outer insulating spacers 118 covering both side walls of each of the dummy gate structures DGS may be formed. Thereafter, the nanosheet semiconductor layers NS may be divided into a plurality of nanosheet stacks NSS by partially removing each of the sacrificial semiconductor layers 104 and the nanosheet semiconductor layers NS using the dummy gate structures DGS and the outer insulating spacers 118 as etch masks. Each of the nanosheet stacks NSS may include the first, second, and third nanosheets N1, N2, and N3. Thereafter, a plurality of recesses R1 may be formed in an upper portion of a fin-type active region FA by etching portions of the fin-type active region FA, which are exposed among the nanosheet stacks NSS. To form the recesses R1, the fin-type active region FA may be etched using dry etching, wet etching, or a combination thereof.

Figure 19D:
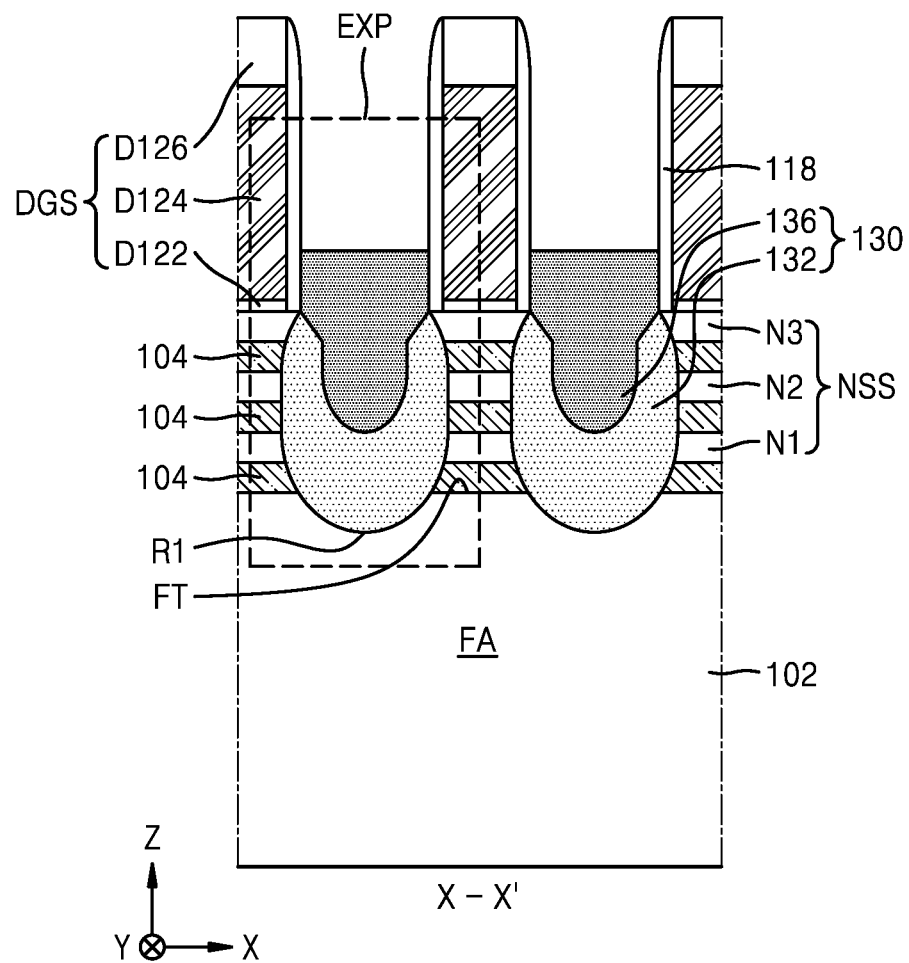

Referring to FIG. 19D, a plurality of source/drain regions 130 may be formed on the fin-type active region FA to be at both sides of each of the nanosheet stacks NSS. To form the source/drain regions 130, the lower main body layer 132 and the upper main body layer 136 may be sequentially formed in each of the recesses R1.

Figure 20A:
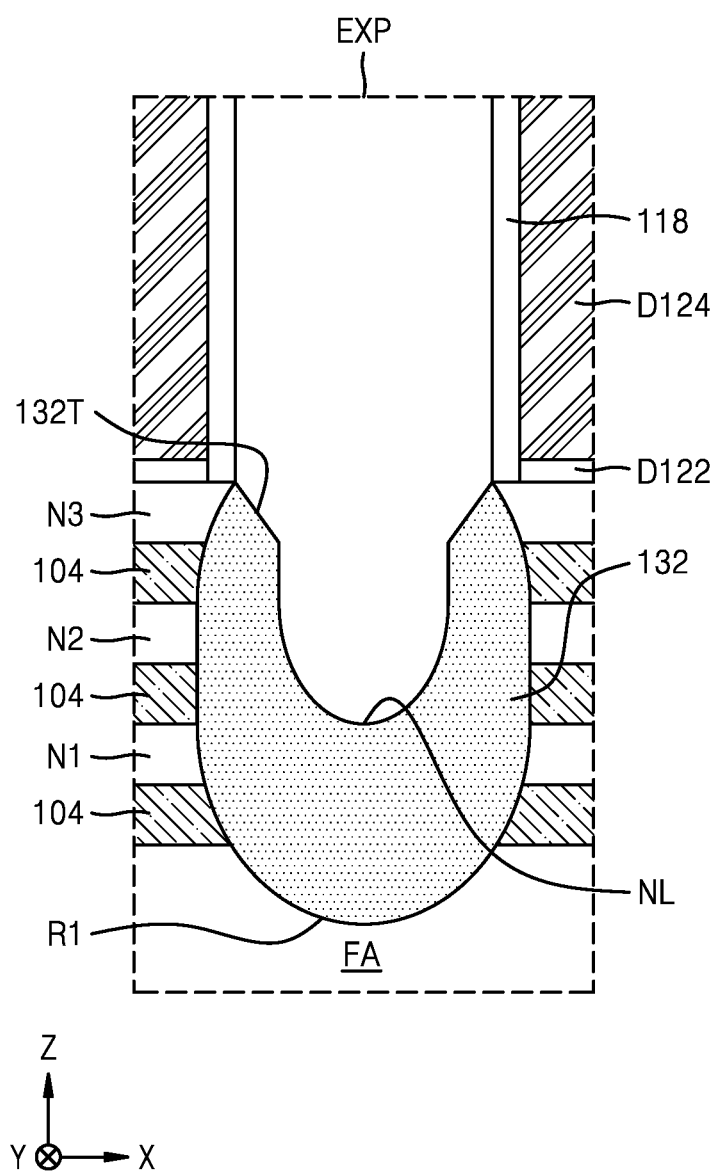
FIGS. 20A and 20B are cross-sectional views of detailed stages in the stage of FIG. 19D.
Figure 20B:
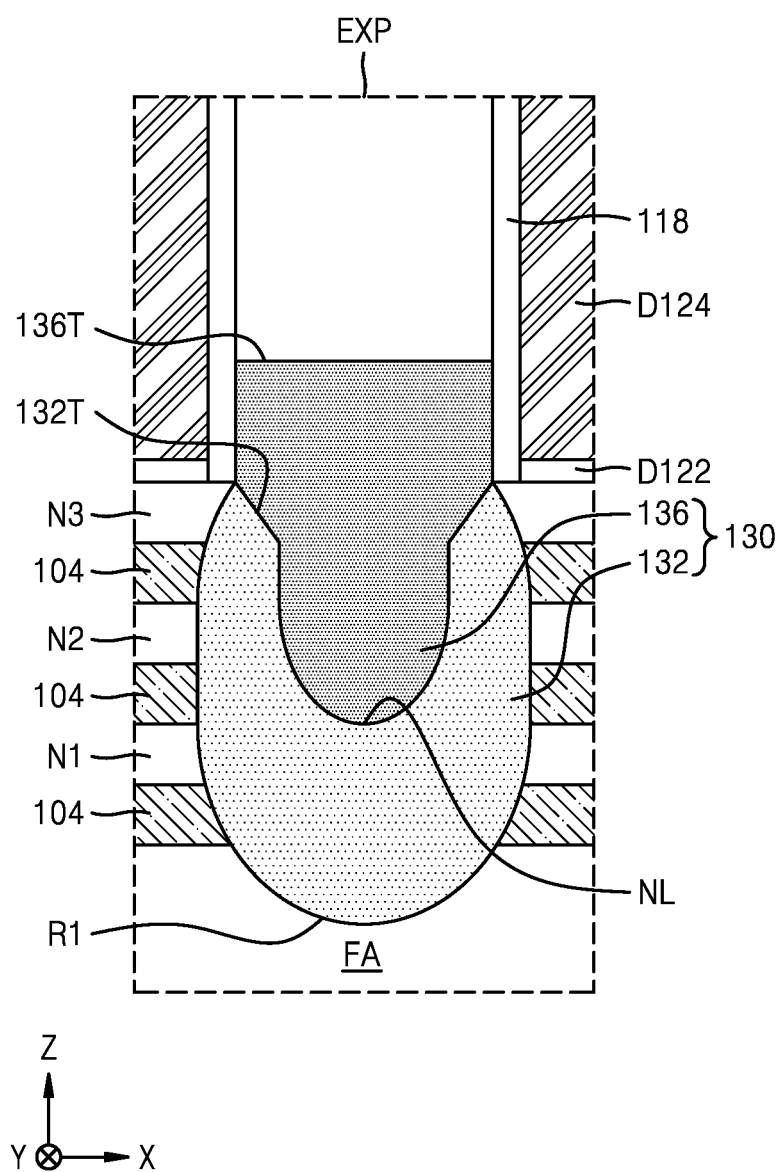

FIGS. 20A and 20B are cross-sectional views provided to describe in detail the stage of forming the source/drain regions 130, which has been described with reference to FIG. 19D, and illustrate enlarged views of a region EXP in FIG. 19D.

Referring to FIG. 20A, the lower main body layer 132 may be formed on the fin-type active region FA in a recess R1 between two adjacent nanosheet stacks NSS.

The lower main body layer 132 may be formed by epitaxially growing a semiconductor material from a surface of the fin-type active region FA exposed at the bottom of the recess R1, side walls of the first, second, and third nanosheets N1, N2, and N3, and side walls of the sacrificial semiconductor layers 104.

In example embodiments, the lower main body layer 132 may be formed by performing low-pressure CVD (LPCVD), selective epitaxial growth (SEG), or cyclic deposition and etching (CDE) using source materials including an elemental semiconductor precursor. The elemental semiconductor precursor may include an element such as Si or Ge.

The lower main body layer 132 may include an SiGe layer. The lower main body layer 132 may be formed using an Si source and a Ge source. Silane (SiH$_4$), disilane (Si$_2$H$_6$), trisilane (Si$_3$H$_8$), dichlorosilane (SiH$_2$Cl$_2$), or the like may be used as the Si source, but embodiments are not limited thereto. Germane (GeH$_4$), digermane (Ge$_2$H$_6$), trigermane (Ge$_3$H$_8$), tetragermane (Ge$_4$H$_{10}$), dichlorogermane (Ge$_2$H$_2$Cl$_2$), or the like may be used as the Ge source, but embodiments are not limited thereto. When the lower main body layer 132 includes an SiGe layer doped with B, a B source may also be used in addition to the Si source and the Ge source to form the SiGe layer doped with B. Diborane (B$_2$H$_6$), triborane, tetraborane, pentaborane, or the like may be used as the B source, but embodiments are not limited thereto. In example embodiments, when the epitaxial growth process is performed to form the lower main body layer 132, B-dopant ion implantation using the B source may be performed in situ.

In example embodiments, when the epitaxial growth process is performed to form the lower main body layer 132, process conditions such as temperature, pressure, the kind of source gases, and a flow rate of a supply gas may be controlled during the epitaxial process such that the top surface of the lower main body layer 132 has the lower facets 132T and the non-linear top surface NL.

Referring to FIG. 20B, the upper main body layer 136 may be formed on the lower main body layer 132 in the resultant structure of FIG. 20A. The upper main body layer 136 may be formed using a process similar to the process of forming the lower main body layer 132, which has been described with reference to FIG. 20A. However, when an epitaxial growth process is performed to form the upper main body layer 136, process conditions such as temperature, pressure, the kind of source gases, and a flow rate of a supply gas may be controlled during the epitaxial process such that the top surface of the upper main body layer 136 has the upper facet 136T.

In example embodiments, when the outer insulating spacers 118 are formed in the process described with reference to FIG. 19C, an atmosphere favorable to form the upper facet 136T on the top surface of the upper main body layer 136 may be created by appropriately selecting a material for the outer insulating spacers 118. For example, an insulating material, e.g., SiN, SiCN, SiBN, SiON, SiOCN, SiBCN, or a combination thereof, which includes the atomic element nitrogen, may be included in an outermost film of each of the outer insulating spacers 118, wherein the outermost film of each outer insulating spacer 118 is in contact with the upper main body layer 136, and a nitrogen atom concentration in the outermost film may be appropriately controlled such that the upper facet 136T having the {100} surface orientation may be formed on the top surface of the upper main body layer 136 when the upper main body layer 136 grows from the outermost film of the outer insulating spacer 118.

In example embodiments, the process of forming the upper main body layer 136 and the process of forming the lower main body layer 132, which has been described with reference to FIG. 20A, may be performed in situ (e.g., sequentially within the same process chamber which may occur without providing a vacuum break to the process chamber).

Figure 19E:
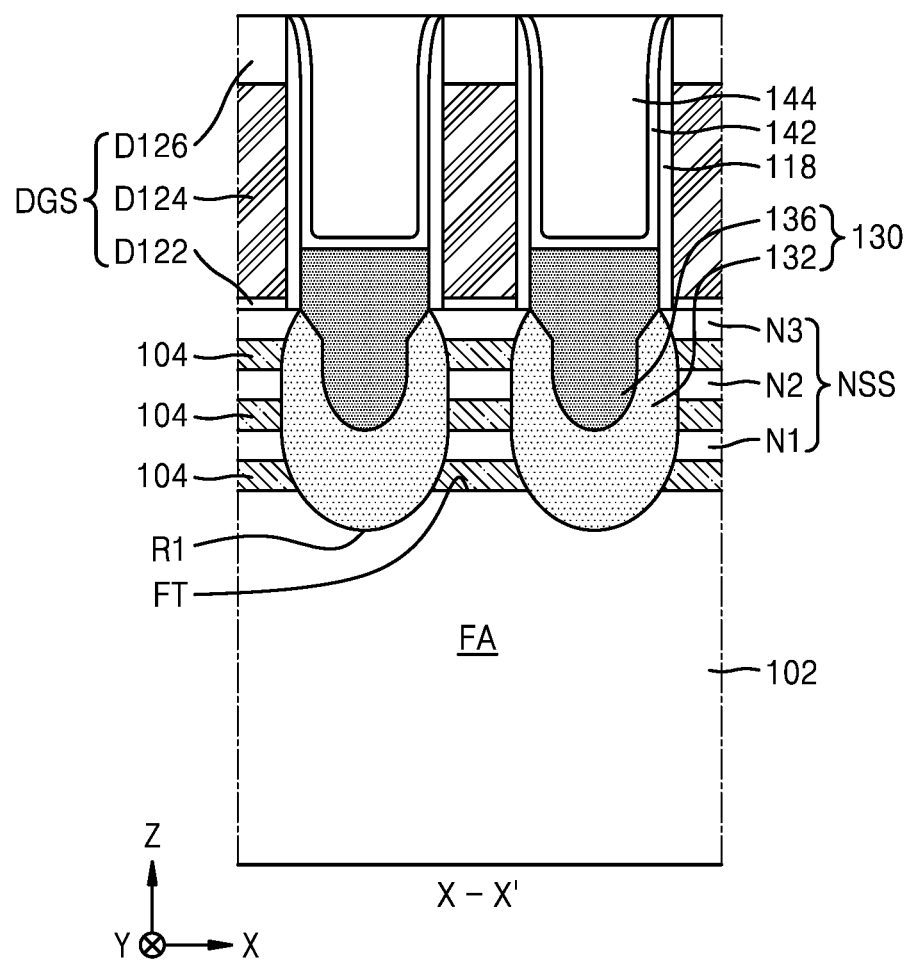

Referring to FIG. 19E, the protective insulating film 142 may be formed to cover the resultant structure of FIG. 19D including the source/drain regions 130, and the intergate insulating film 144 may be formed on the protective insulating film 142. Thereafter, the top surface of the capping layer D126 may be exposed by planarizing the protective insulating film 142 and the intergate insulating film 144.

Figure 19F:
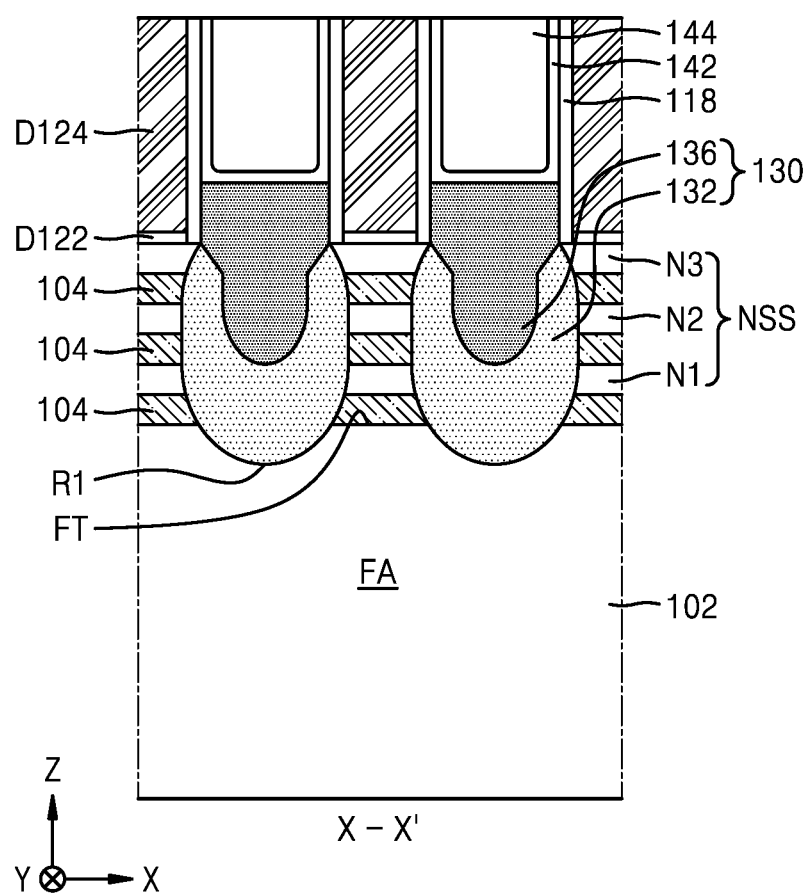

Referring to FIG. 19F, the top surface of the dummy gate layer D124 may be exposed by removing the capping layer D126 from the resultant structure of FIG. 19E, the protective insulating film 142 and the intergate insulating film 144 may be partially removed such that the top surface of the intergate insulating film 144 is substantially at the same level as the top surface of the dummy gate layer D124.

Figure 19G:
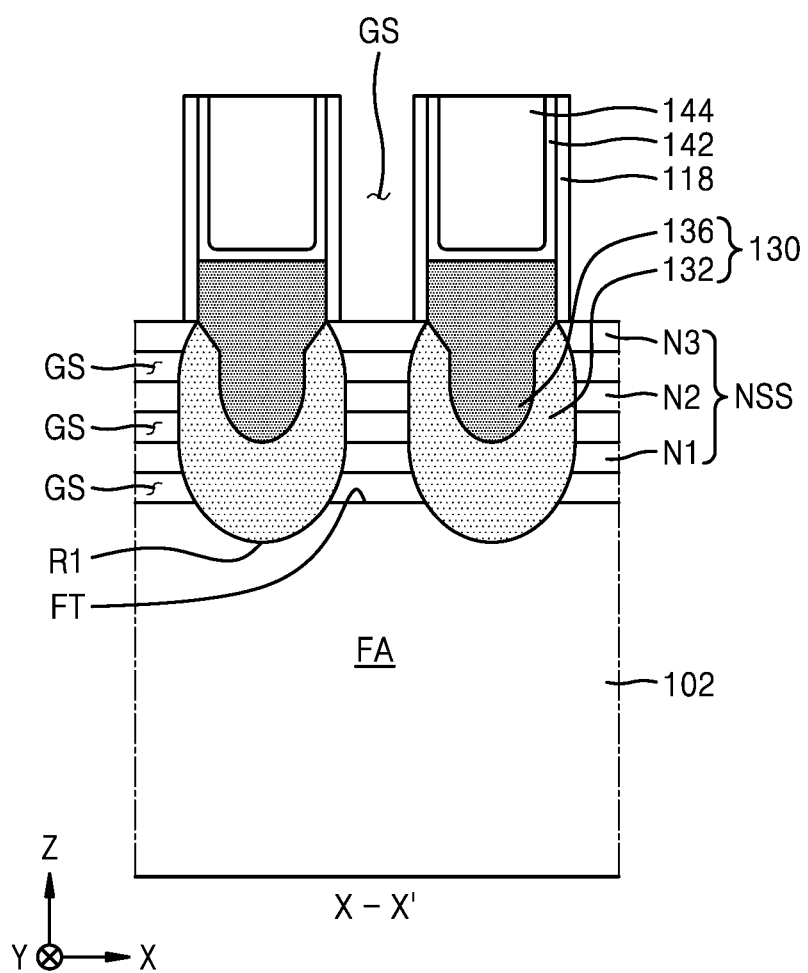

Referring to FIG. 19G, a gate space GS may be formed by removing the dummy gate layer D124 and the oxide film D122 from the resultant structure of FIG. 19F, and accordingly, a plurality of nanosheet stacks NSS may be exposed by the gate space GS Thereafter, the sacrificial semiconductor layers 104 remaining on the fin-type active region FA may be removed through the gate space GS such that the gate space GS may extend to spaces among the first, second, and third nanosheets N1, N2, and N3 and the fin top FT.

In example embodiments, to selectively remove the sacrificial semiconductor layers 104, a difference in etch selectivity between the sacrificial semiconductor layers 104 and the first, second, and third nanosheets N1, N2, and N3 may be used. To selectively remove the sacrificial semiconductor layers 104, a liquid or gas etchant may be used. In example embodiments, to selectively remove the sacrificial semiconductor layers 104, a $CH_3COOH$-based etchant, e.g., an etchant including a mixture of $CH_3COOH$, $HNO_3$, and HF or a mixture of $CH_3COOH$, $H_2O_2$, and HF, may be used, but embodiments are not limited thereto.

Figure 19H:
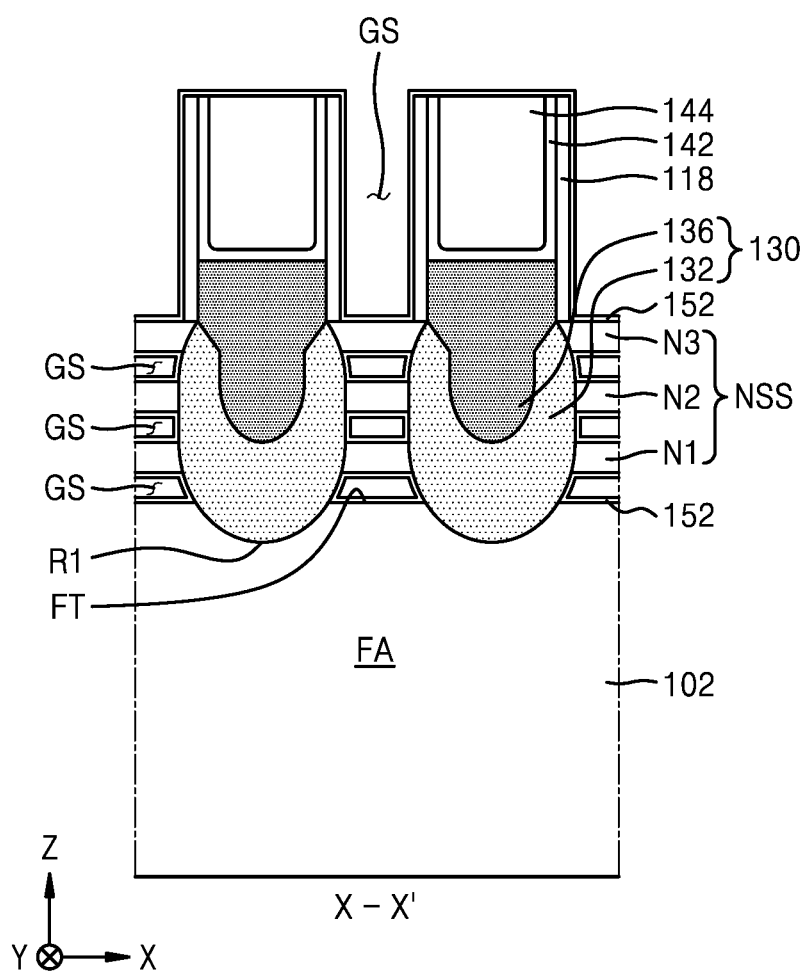

Referring to FIG. 19H, the gate dielectric film 152, which covers the exposed surfaces of the first, second, and third nanosheets N1, N2, and N3 and the fin-type active region FA. Atomic layer deposition (ALD) may be used to form the gate dielectric film 152.

Figure 19I:
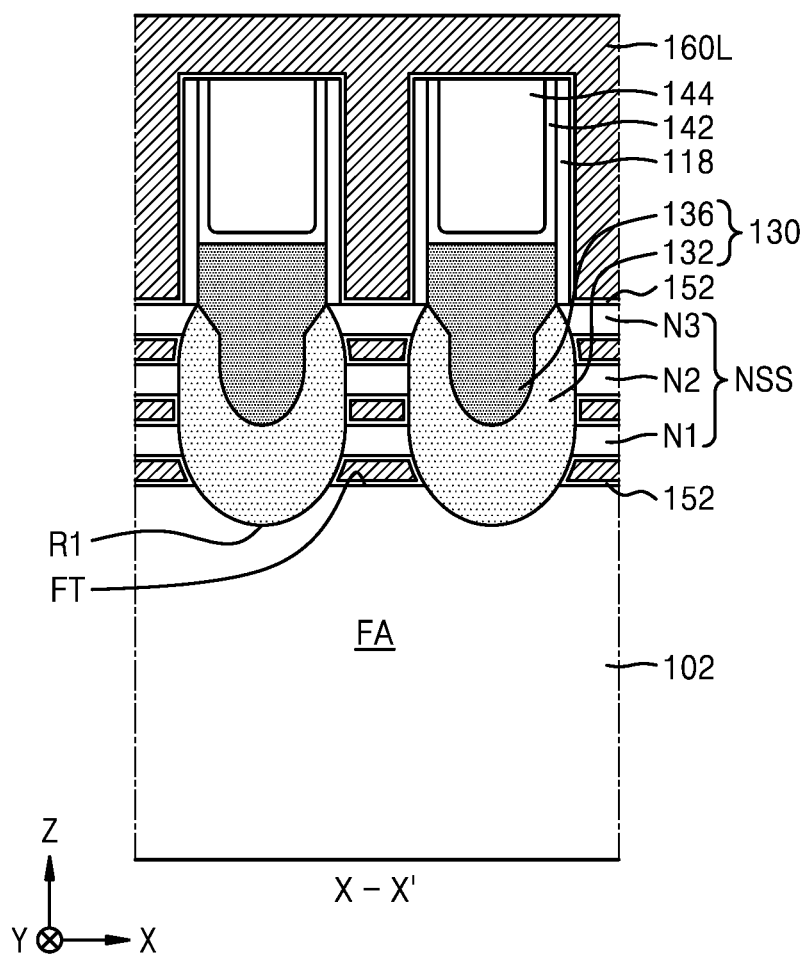

Referring to FIG. 19I, a gate forming conductive layer 160L may be formed on the gate dielectric film 152 to fill the gate space GS (see FIG. 19H) and cover the top surface of the intergate insulating film 144. The gate forming conductive layer 160L may include metal, metal nitride, metal carbide, or a combination thereof ALD or CVD may be performed to form the gate forming conductive layer 160L.

Figure 19J:
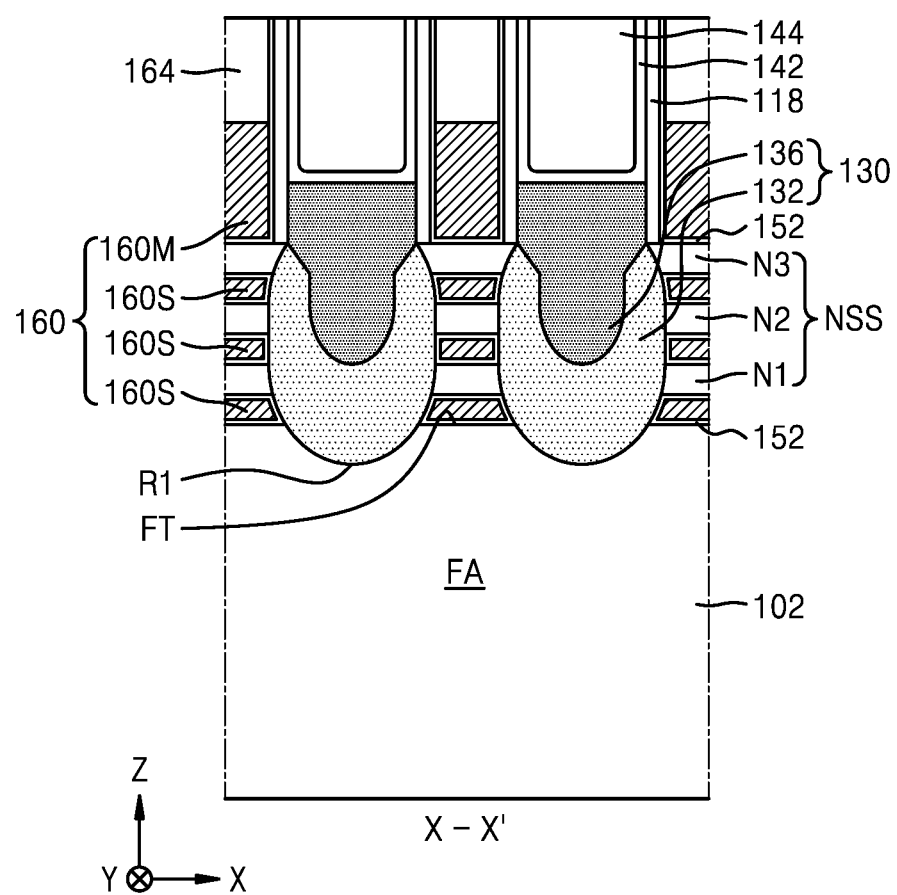

Referring to FIG. 19J, a gate line 160 may be formed by partially removing the gate forming conductive layer 160L and the gate dielectric film 152 from the top of the resultant structure of FIG. 19I such that the top surface of the intergate insulating film 144 is exposed and an upper portion of the gate space GS is emptied. Thereafter, a capping insulating pattern 164 may be formed on the gate line 160 to fill the gate space GS Although the example method of manufacturing the integrated circuit device 100 of FIGS. 1, 2A and 2B has been described with reference to FIGS. 19A through 19J, it will be understood by those skilled in the art that the integrated circuit devices illustrated in FIGS. 3A through 18 and other integrated circuit devices having various structures modified and changed therefrom may be manufactured by making various modifications and changes in the descriptions given with reference to FIGS. 19A through 19J, without departing from the scope of the inventive concept.

In example embodiments, to manufacture the integrated circuit device 100A of FIGS. 3A and 3B, after the processes described with reference to FIGS. 19A through 19J are performed, a plurality of contact holes 180H exposing the source/drain regions 130 may be formed by partially etching the intergate insulating film 144, the protective insulating film 142, and the source/drain regions 130. The metal silicide film 182 may be formed on the surface of each of the source/drain regions 130 exposed by the contact holes 180H, and the source/drain contact 184 may be formed on the metal silicide film 182 to fill each of the contact holes 180H.

In example embodiments, to manufacture the integrated circuit device 100B, 200, or 300 of FIG. 4, 8, or 9, after the lower main body layer 132 and the upper main body layer 136 are formed as described above with reference to FIGS. 19D, 20A, and 20B, the capping layer 138, 238, or 338 covering the upper facet 136T of the upper main body layer 136 may be formed before the process of FIG. 19E is performed.

LPCVD, SEG, or CDE may be performed to form the capping layer 138, 238, or 338. To form the capping layer 138, 238, or 338, the Si source described with reference to FIG. 20A may be used. When the capping layer 138, 238, or 338 includes an Si layer doped with B, a B source may also be used in addition to the Si source to form the capping layer 138, 238, or 338. The specific examples of the B source have been described with reference to FIG. 20A.

In example embodiments, when an epitaxial growth process is performed to form the capping layer 138, 238, or 338, process conditions such as temperature, pressure, the kind of source gases, and a flow rate of a supply gas may be appropriately controlled during the epitaxial process so that the capping layer 138 in FIG. 4, capping layer 238 in FIG. 8, or the capping layer 338 in FIG. 9 may be formed.

Figure 21:
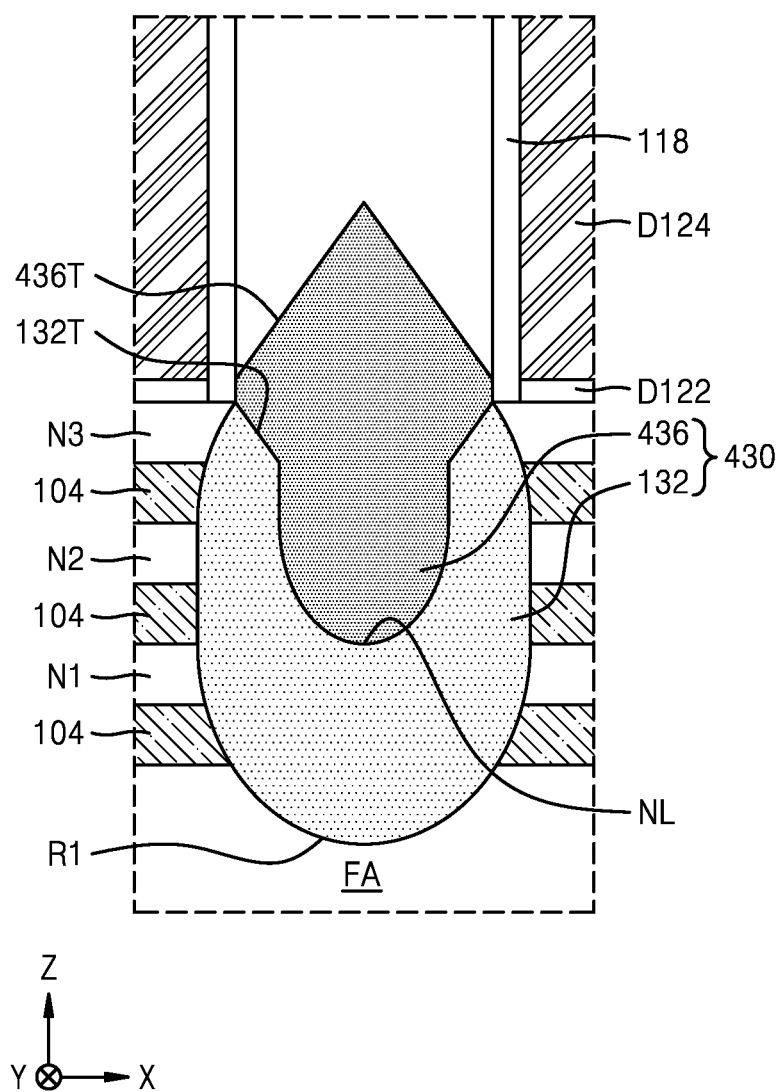
FIG. 21 is a cross-sectional view of a stage in a method of manufacturing an integrated circuit device, according to some embodiments.

FIG. 21 is a cross-sectional view of a stage in a method of manufacturing an integrated circuit device, according to some embodiments. FIG. 21 illustrates an enlarged view of the region EXP in FIG. 19D. An example method of manufacturing the integrated circuit device 400 of FIGS. 10A and 10B will be described with reference to FIG. 21.

Referring to FIG. 21, after the processes described with reference to FIGS. 19A through 19C are performed, a plurality of source/drain regions 430 may be formed on the fin-type active region FA to be at both sides of each of the nanosheet stacks NSS using a method similar to that described with reference to FIG. 19D. To form the source/drain regions 430, the lower main body layer 132 may be formed in the recess R1 using the method described with reference to FIG. 20A, and then the upper main body layer 436 may be formed using a method similar to the method of forming the upper main body layer 136, which has been described with reference to FIG. 20B. However, when an epitaxial growth process is performed to form the upper main body layer 436, process conditions such as temperature, pressure, the kind of source gases, and a flow rate of a supply gas may be controlled during the epitaxial process such that the top surface of the upper main body layer 436 has a pair of upper facets 436T.

In example embodiments, when the outer insulating spacers 118 are formed in the process described with reference to FIG. 19C, an atmosphere favorable to form the upper facets 436T on the top surface of the upper main body layer 436 may be created by appropriately selecting a material for the outer insulating spacers 118. For example, an insulating material, e.g., SiON, SiOCN, SiOC, or a combination thereof, which includes the atomic element oxygen, may be included in an outermost film of each of the outer insulating spacers 118, wherein the outermost film of each outer insulating spacer 118 is in contact with the upper main body layer 436, and an oxygen atom concentration in the outermost film may be appropriately controlled such that the upper facets 436T having the {111} surface orientation may be formed on the top surface of the upper main body layer 436 when the upper main body layer 436 grows from the outermost surface of the outer insulating spacer 118.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a fin-type active region on a substrate and extending in a first horizontal direction;
   at least one nanosheet separated from a fin top of the fin-type active region in a vertical direction and having a bottom surface facing the fin top of the fin-type active region;
   a gate line on the fin-type active region, surrounding the at least one nanosheet, and extending in a second horizontal direction that is different from the first horizontal direction; and
   a source/drain region on the fin-type active region, adjacent to the gate line, and in contact with the at least one nanosheet,
   wherein the source/drain region includes a lower main body layer and an upper main body layer, the lower and upper main body layers being sequentially stacked on the fin-type active region in the vertical direction,
   wherein a top surface of the lower main body layer includes a lower facet declining toward the substrate as it extends in a direction from the at least one nanosheet to a center of the source/drain region,
   wherein the upper main body layer includes a bottom surface contacting the lower facet of the top surface of the lower main body layer, and a top surface having an upper facet,
   wherein with respect to a vertical cross section, the lower facet extends along a first line, the upper facet extends along a second line, and
   wherein the first line and the second line intersect each other.

2. The integrated circuit device of claim 1, wherein the lower facet of the top surface of the lower main body layer has a {111} surface orientation, and the upper facet of the top surface of the upper main body layer has a {100} surface orientation.

3. The integrated circuit device of claim 1, wherein each of the lower facet of the top surface of the lower main body layer and the upper facet of the top surface of the upper main body layer has a {111} surface orientation.

4. The integrated circuit device of claim 1, further comprising an outer insulating spacer above the at least one nanosheet, the outer insulating spacer covering a side wall of the gate line, and having a first surface in contact with the source/drain region,
   wherein, with respect to the vertical cross section, an angle between an extending direction of the first surface of the outer insulating spacer and an extending direction of the upper facet of the top surface of the upper main body layer is about 90 degrees.

5. The integrated circuit device of claim 1, further comprising an outer insulating spacer above the at least one nanosheet, the outer insulating spacer covering a side wall of the gate line, and having a first surface in contact with the source/drain region,
   wherein, with respect to the vertical cross section, an angle between an extending direction of the first surface of the outer insulating spacer and an extending direction of the upper facet of the top surface of the upper main body layer is about 54 degrees to about 55 degrees.

6. The integrated circuit device of claim 1, wherein
   the lower main body layer includes a first lower main body layer and a second lower main body layer, the first and second lower main body layers being sequentially stacked on the fin-type active region in the vertical direction,
   the first lower main body layer includes a first lower facet and a first non-linear top surface, the first lower facet being in contact with the upper main body layer, and the first non-linear top surface being in contact with the second lower main body layer,
   the second lower main body layer includes a second lower facet and a second non-linear top surface, the second lower facet being in contact with the upper main body layer, and the second non-linear top surface being in contact with the upper main body layer, and
   the first lower facet and the second lower facet lie within a first plane.

7. The integrated circuit device of claim 1, wherein
   the lower main body layer includes a first lower main body layer and a second lower main body layer, the first and second lower main body layers being sequentially stacked on the fin-type active region in the vertical direction, and
   each of the first lower main body layer and the second lower main body layer includes a corresponding facet contacting the upper main body layer and having a {111} surface orientation.

8. The integrated circuit device of claim 1, wherein
   the upper main body layer includes a first upper main body layer and a second upper main body layer, the first and second upper main body layers being sequentially stacked on the lower main body layer in the vertical direction,
   a top surface of the first upper main body layer has a first facet having a {100} surface orientation,
   a top surface of the second upper main body layer has a second facet having one of a {100} surface orientation and a {111} surface orientation, and
   a bottom surface of the second upper main body layer is in contact with the lower facet and the first facet.

9. The integrated circuit device of claim 1, further comprising:
   an outer insulating spacer above the at least one nanosheet, the outer insulating spacer covering a side wall of the gate line, and being in contact with the source/drain region; and
   a source/drain contact on the source/drain region and having a lower portion surrounded by the source/drain region,
   wherein the upper facet of the top surface of the upper main body layer extends between the outer insulating spacer and the source/drain contact in the first horizontal direction.

10. The integrated circuit device of claim 1, further comprising:
    an outer insulating spacer above the at least one nanosheet, the outer insulating spacer covering a side wall of the gate line, and being in contact with the source/drain region; and
    a source/drain contact on the source/drain region, the source/drain contact having a lower portion surrounded by the source/drain region, wherein the upper facet of the top surface of the upper main body layer slants upwardly from the outer insulating spacer to the source/drain contact.

11. The integrated circuit device of claim 1, wherein
the source/drain region further includes a capping layer contacting the upper facet of the upper main body layer, and
a top surface of the capping layer includes a capping facet parallel to one of the lower facet and the upper facet.

12. The integrated circuit device of claim 1, wherein
the source/drain region further includes a capping layer contacting the upper facet of the upper main body layer,
a top surface of the capping layer includes a capping facet, and
with respect to a vertical cross section, the capping facet extends along a third line that intersects one of the first line and the second line.

13. An integrated circuit device comprising:
a fin-type active region on a substrate and extending in a first horizontal direction;
a recess formed in the fin-type active region;
a pair of nanosheet stacks on a fin top of the fin-type active region, the pair of nanosheet stacks being separated from each other in the first horizontal direction with the recess formed therebetween;
a pair of gate lines on the fin-type active region, each gate line surrounding a corresponding one of the pair of nanosheet stacks, and extending in a second horizontal direction that is different from the first horizontal direction; and
a source/drain region in the recess and in contact with each one of the pair of nanosheet stacks,
wherein the source/drain region includes a lower main body layer and an upper main body layer, the lower and upper main body layers being sequentially stacked in the recess in the vertical direction,
wherein a top surface of the lower main body layer includes a pair of lower facets each declining toward the substrate as it extends in a direction from one of the pair of nanosheet stacks to a center of the source/drain region,
wherein the upper main body layer includes a bottom surface contacting the pair of lower facets and a top surface having an upper facet,
wherein with respect to a vertical cross section, each lower facet extends along a corresponding first line, the upper facet extends along a second line, and
wherein each first line and the second line intersect each other.

14. The integrated circuit device of claim 13, wherein a topmost level of the upper facet is higher than a topmost level of the pair of nanosheet stacks.

15. The integrated circuit device of claim 13, wherein
the pair of lower facets have a {111} surface orientation, and
the upper facet includes a single flat surface having a {100} surface orientation that extends in the first horizontal direction.

16. The integrated circuit device of claim 13, wherein
the upper facet includes a first upper facet and a second upper facet, the first and second upper facets each having a {111} surface orientation that are oriented in different directions; and
the first upper facet meets the second upper facet at a center of a region between the pair of gate lines in the first horizontal direction.

17. The integrated circuit device of claim 13, further comprising an outer insulating spacer covering a side wall of one of the pair of gate lines and having a first surface in contact with the upper main body layer,
wherein, with respect to the vertical cross section, an angle between an extending direction of the first surface of the outer insulating spacer and an extending direction of the upper facet is about 90 degrees.

18. The integrated circuit device of claim 13, further comprising an outer insulating spacer covering a side wall of one of the pair of gate lines and having a first surface in contact with the upper main body layer,
wherein, with respect to the vertical cross section, an angle between an extending direction of the first surface of the outer insulating spacer and an extending direction of the upper facet is about 54 degrees to about 55 degrees.

19. An integrated circuit device comprising:
a fin-type active region on a substrate and extending in a first horizontal direction;
a recess formed in the fin-type active region;
a pair of nanosheet stacks on a fin top of the fin-type active region, the pair of nanosheet stacks being separated from each other in the first horizontal direction, with the recess therebetween; and
a source/drain region in the recess and in contact with each one of the pair of nanosheet stacks,
wherein the source/drain region includes a lower main body layer and an upper main body layer, the lower and upper main body layers being sequentially stacked in the recess in the vertical direction and each including an $Si_{1-x}Ge_x$ layer, where $0.15 \leq x < 0.7$,
wherein the lower main body layer has a first Ge concentration, and a top surface of the lower main body layer includes a pair of lower facets each declining toward the substrate as it extends in a direction from a corresponding one of the pair of nanosheet stacks to a center of the source/drain region,
wherein the upper main body layer has a Ge concentration higher than the first Ge concentration and includes a bottom surface contacting the pair of lower facets and a top surface having an upper facet,
wherein with respect to a vertical cross section, each lower facet extends along a corresponding first line, the upper facet extends along a second line, and
wherein each first line and the second line intersect each other.

20. The integrated circuit device of claim 19,
wherein the source/drain region further includes a capping layer contacting the upper facet of the upper main body layer and having a capping facet having one of a {100} surface orientation and a {111} surface orientation, and
wherein the capping layer includes an undoped Si layer or an Si layer doped with a p-type dopant.

* * * * *